(12) United States Patent
Shintani et al.

(10) Patent No.: US 8,451,592 B2
(45) Date of Patent: May 28, 2013

(54) ELECTRONIC PACKAGE, DISPLAY DEVICE, AND ELECTRONIC DEVICE

(75) Inventors: Norihisa Shintani, Osaka (JP); Nobuaki Takahashi, Osaka (JP); Masahiro Imai, Osaka (JP); Koichi Yoshioka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 226 days.

(21) Appl. No.: 12/989,005

(22) PCT Filed: Mar. 13, 2009

(86) PCT No.: PCT/JP2009/054839
§ 371 (c)(1),
(2), (4) Date: Oct. 21, 2010

(87) PCT Pub. No.: WO2009/130955
PCT Pub. Date: Oct. 29, 2009

(65) Prior Publication Data
US 2011/0038112 A1    Feb. 17, 2011

(30) Foreign Application Priority Data
Apr. 22, 2008  (JP) .................................. 2008-111064

(51) Int. Cl.
*G06F 1/16*     (2006.01)

(52) U.S. Cl.
USPC ....................... 361/679.01; 349/150; 345/173

(58) Field of Classification Search
USPC ........................ 345/173; 349/150; 361/679.01
See application file for complete search history.

(56) References Cited

U.S. PATENT DOCUMENTS

| | | | |
|---|---|---|---|
| 6,342,933 B1 | 1/2002 | Nakamura et al. | |
| 7,495,738 B2 * | 2/2009 | Okuda | 349/150 |
| 7,738,244 B2 * | 6/2010 | Noguchi et al. | 361/679.21 |
| 8,223,291 B2 * | 7/2012 | Kim | 349/58 |
| 2001/0000763 A1 | 5/2001 | Muramatsu | |

(Continued)

FOREIGN PATENT DOCUMENTS

| EP | 1 892 560 A2 | 2/2008 |
|---|---|---|
| JP | 6-40990 | 5/1994 |

(Continued)

OTHER PUBLICATIONS

European Office Action for corresponding application No. 09 735 308.0-2205 dated Feb. 9, 2012.

(Continued)

*Primary Examiner* — Lisa Lea Edmonds
(74) *Attorney, Agent, or Firm* — Birch, Stewart, Kolasch & Birch, LLP

(57) ABSTRACT

Provided is a liquid crystal display device (69) including: a liquid crystal display panel unit (49); a backlight unit (59); and a front bezel (BZ1) and a rear bezel (BZ2) for housing the liquid crystal display panel unit and the backlight unit. The liquid crystal display panel unit includes an FPC board (1) which winds around side walls (WL2) and a bottom surface (31) of the rear bezel so as to cover the side walls (WL2) and the bottom surface (31). Outer claw sections (CW1) projecting inward from the side walls (WL1) of the front bezel and inner claw sections (CW2) projecting outward from the side walls of the rear bezel are engaged with each other through openings (HL) provided in the FPC board, thereby integrating the front bezel and the rear bezel.

14 Claims, 15 Drawing Sheets

U.S. PATENT DOCUMENTS

| | | |
|---|---|---|
| 2004/0026056 A1 | 2/2004 | Schweiger |
| 2004/0183959 A1 | 9/2004 | Ishida |
| 2007/0019275 A1 | 1/2007 | Okuda |
| 2007/0117418 A1 | 5/2007 | Azuma et al. |
| 2007/0132908 A1 | 6/2007 | Kim et al. |
| 2007/0290965 A1 | 12/2007 | Shiraishi |
| 2011/0038128 A1* | 2/2011 | Kitagawa et al. ............. 361/749 |

FOREIGN PATENT DOCUMENTS

| | | |
|---|---|---|
| JP | 2002-372922 A | 12/2002 |
| JP | 2005-283828 A | 10/2005 |
| JP | 2007-121594 A | 5/2007 |
| JP | 2007-171459 A | 7/2007 |
| RU | 2 210 197 C1 | 8/2003 |
| RU | 2 234 205 C1 | 8/2004 |
| RU | 1840492 A1 | 3/2007 |
| RU | 2006129798 A | 3/2008 |

OTHER PUBLICATIONS

European Search Report for Application No. 09735308.0-2205; Mar. 18, 2011.

* cited by examiner

ELECTRONIC PACKAGE, DISPLAY DEVICE, AND ELECTRONIC DEVICE

TECHNICAL FIELD

The present invention relates to an electronic package, a display device, and an electronic device.

BACKGROUND ART

In these days, an electronic device employs a flexible printed circuit (FPC) board which has flexibility. For example, in a liquid crystal display device 169 described in Patent Document 1, as illustrated in FIG. 15, an FPC board (circuit board) 101 is connected to a liquid crystal display panel 141.

In the liquid crystal display device 169, the FPC board 101 droops and bends to cover a side wall w3a of a built-in chassis cs (it is to be noted that the built-in chassis cs is a member for holding a light guide plate 154, a reflection sheet 155, a light emitting diode (LED) module mj, and optical sheets 156 to 158).

Patent Document 1: JP 2007-171459 A

DISCLOSURE OF THE INVENTION

Problem to be Solved by the Invention

In the case of the liquid crystal display device 169 as in Patent Document 1, by fitting protrusions 181 formed on a side wall w3b of the built-in chassis (housing) cs into small holes 182 formed in a side wall w2b of a bezel (housing) bz2, the built-in chassis cs and the bezel bz2 are integrated (it is to be noted that integrated housings are hereinafter referred to as a housing unit and a housing unit having a circuit board mounted therein is hereinafter referred to as an electronic package).

However, positions of the protrusions 181 and the small holes 182 are restricted by the FPC board 101. The reason is that, even when the protrusions 181 are formed on the side wall w3a of the built-in chassis cs and the small holes 182 are formed in the side wall w2a of the bezel bz2, if the FPC board 101 covers the side wall w3a, the protrusions 181 do not fit into the small holes 182.

With this, the positions and the number of engaging sections such as the protrusions 181 and the small holes 182 for engaging the built-in chassis cs with the bezel bz2 are restricted, and thus, there is a possibility that the extent of the engagement between the built-in chassis cs and the bezel bz2 (strength as a housing unit) is decreased.

The present invention is made in view of the above. An object of the present invention is to provide an electronic package and the like in which positioning of an engaging section is not restrained by a circuit board.

Means for Solving the Problem

An electronic package includes a circuit board which is mounted in a housing unit, the housing unit being formed by integrating a plurality of housings, the housing unit being integrated through engagement of engaging sections included in the respective housings. Further, in the electronic package, the circuit board includes an opening, and at least one of the engaging sections which engage with each other passes through the opening.

With the above-mentioned structure, the positions of the engaging sections are not restrained by the existence of the circuit board. More specifically, the existence of the circuit board does not require the necessity to position the engaging sections so as not to interfere with the circuit board. Therefore, the degree of flexibility in positioning the engaging sections becomes higher. It follows that, for example, the engaging sections may be formed at positions appropriate for increasing the extent of engagement of the housing unit.

Further, it is preferred that one of the engaging sections which passes through the opening enter the opening from an inside to an outside, provided that, in the circuit board which winds and bends, a side surrounded by the circuit board is the inside and a side opposite to the inside is the outside.

With the above-mentioned structure, because the engaging section covered with the circuit board appears to the outside through the opening, when one housing covers another housing, a user sees the engaging section. Therefore, it is easier to position another engaging section with respect to the engaging section, and hence the manufacturing efficiency of the electronic package may be improved.

It should be noted that the present invention is not limited thereto, and one of the engaging sections which passes through the opening may enter the opening from an outside to an inside, provided that, in the circuit board which winds and bends, a side surrounded by the circuit board is the inside and a side opposite to the inside is the outside.

Even if the structure as described above is employed, because the opening which covers the engaging section is a mark, when the one housing covers the another housing, positioning of another engaging section with respect to the engaging section becomes easier, and hence the manufacturing efficiency of the electronic package may be improved.

When the engaging sections which engage with each other are claw-like, the following is preferred. That is, it is preferred that, in the housings which are engaged with each other in the housing unit, the claw-like engaging section included in one housing extends to a side on which the one housing is separated away from another housing, while the claw-like engaging section included in the another housing extends to a side on which the another housing is separated away from the one housing.

With the above-mentioned structure, as the engaged housings struggle to move farther away from each other, the engaging sections more firmly engage with each other. Therefore, the extent of the engagement of the housings is further increased.

Further, only one of the engaging sections which engage with each other may be the engaging section which passes through the opening. For example, among the engaging sections which engage with each other, one engaging section may be convex and another engaging section may be concave, and the convex engaging section may enter the opening from one board surface of the circuit board.

With the above-mentioned structure, when the engaging sections which engage with each other are convex and concave, because the convex engaging section fits into the concave engaging section, the thickness of the convex section is not added to the thickness of the housing unit. Therefore, for example, when the engaging sections are positioned at side walls of the housing unit, the thickness of the side walls may be relatively small.

Further, it is preferred that the engaging sections which engage with each other be positioned at side walls of the housing unit.

With the above-mentioned structure, the thickness of the engaging sections is not added to the thickness of the housing unit. Therefore, an electronic package which is relatively thin is completed.

Further, it is preferred that the housings include a catching section for causing the circuit board to be unmovable with respect to the housing unit by catching on an edge of the opening.

With the above-mentioned structure, because, when the circuit board becomes unmovable, a member connected to the circuit board also becomes unmovable accordingly, inconvenience due to displacement of the member is not caused.

It should be noted that the circuit board is divided into two according to a dividing line which passes through the opening, to thereby provide one region having a smaller area, which is a small area region, and another region having a larger area, which is a large area region. In this case, it is preferred that the catching section pull a portion of the circuit board which is the small area region toward a portion of the circuit board which is the large area region, provided that a line along a shape of the circuit board which bends is a bending line, a virtual plane which includes the bending line and intersects a board surface of the circuit board is a first virtual plane, and a line which intersects the first virtual plane is the dividing line.

Usually, when the circuit board bends, the portion of the circuit board which is the small area region trys to, by resilience, move by a relatively large amount with respect to the portion of the circuit board which is the large area region. However, if the catching section is adapted to pull the portion of the circuit board which is the small area region toward the portion of the circuit board which is the large area region, the portion of the circuit board which is the small area region is unmovable.

It is to be noted that the engaging section may be the catching section. More specifically, the engaging section may be adapted to catch on the edge of the opening.

A display device including the electronic package described above which is mounted thereon can also be said to be the present invention.

Further, in such a display device, the circuit board is connected to a display panel for displaying a display image, and the display panel includes a control element mounted thereon so as to be along the circuit board. The control element includes a plurality of element wirings, and the plurality of element wirings include a main element wiring group which is a group of main element wirings. Further, in the display device, it is preferred that the opening be positioned at an isolated place which does not interfere with the main supply wiring group, provided that supply wirings of the circuit board which are connected to the main element wirings are main supply wirings and a group of the main supply wirings is the main supply wiring group.

With the above-mentioned structure, for example, the main supply wirings are not required to have extra length so as not to interfere with the opening. Therefore, not only the cost of the circuit board is suppressed but also packaging of the main supply wirings with respect to the circuit board becomes easier.

It is to be noted that an example of the above-mentioned isolated place is a place along an outer edge in the circuit board. Further, as another example, a display device as described below may be provided.

That is, there may be provided a display device in which the plurality of element wirings include an auxiliary element wiring group which is a group of auxiliary element wirings, and the isolated place is positioned on a bending line which passes through an auxiliary supply wiring group, provided that supply wirings of the circuit board which are connected to the auxiliary element wirings are auxiliary supply wirings and a group of the auxiliary supply wirings is the auxiliary supply wiring group, and provided that a line along a shape of the circuit board which bends is the bending line.

Further, it is preferred that at least part of the main supply wirings be positioned at a portion of the circuit board at which the circuit board bends, and the main supply wiring positioned at the portion of the circuit board at which the circuit board bends be in a shape which conforms to the shape of the circuit board which bends.

With the above-mentioned structure, even when the circuit board bends, no load in an oblique direction is applied to the main supply wirings. Therefore, the main supply wirings are less liable to be broken.

It is to be noted that an electronic device including the display device which is described above mounted thereon can also be said to be the present invention.

Effects of the Invention

According to the present invention, at least one of the engaging sections which engage with each other passes through the opening in the circuit board. Therefore, the positions of the engaging sections are not restrained by the circuit board. Thus, the engaging sections are freely disposed at required positions for firmly integrating the housings.

DESCRIPTION OF SYMBOLS

Figure 1:
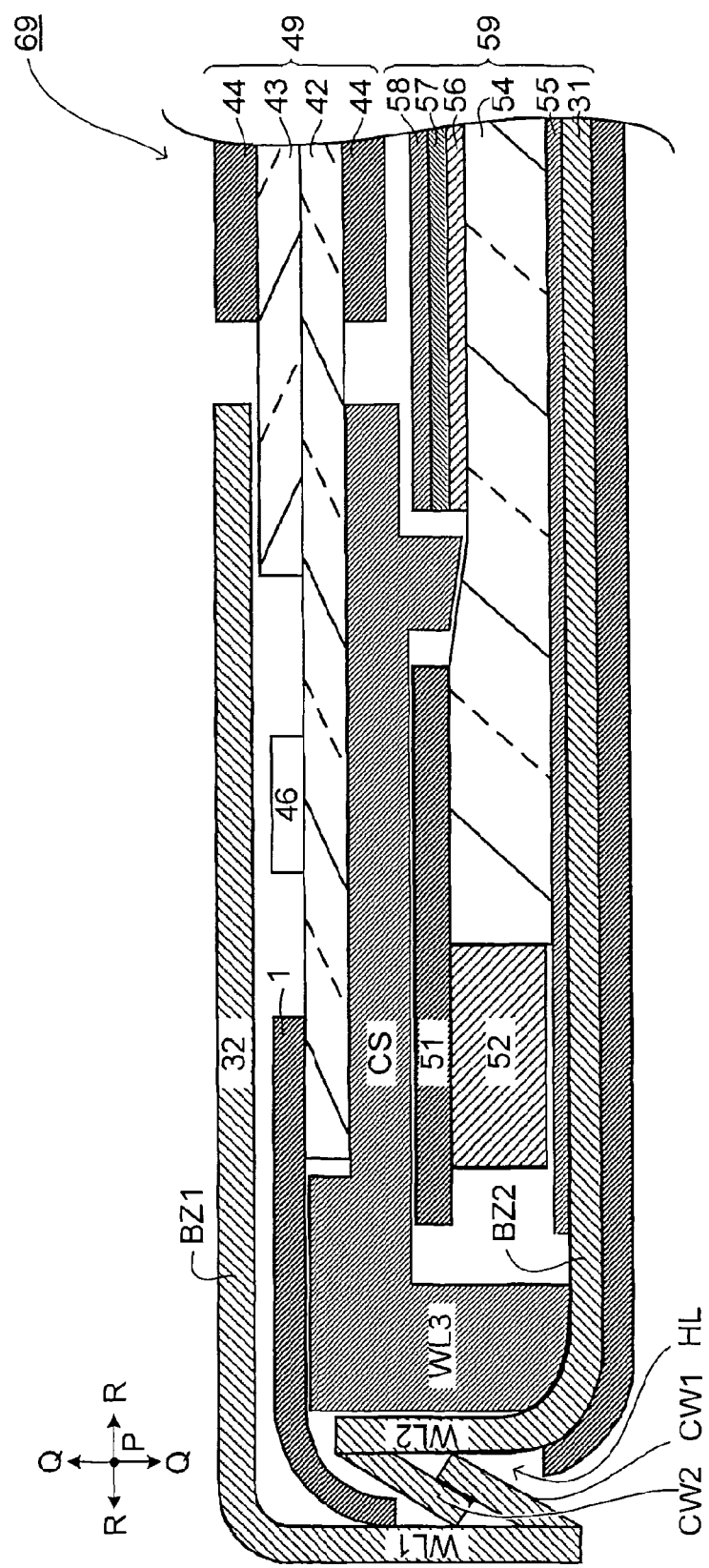
FIG. 1 is a sectional view taken in the arrows A1-A1' direction of a liquid crystal display device illustrated in FIG. 2.

BZ bezel (housing)
WL side wall

CW claw section (engaging section)
BZ1 front bezel (housing)
WL1 outer side wall (side wall)
CW1 outer claw section (engaging section)
35 concave section (engaging section)
BZ2 rear bezel (housing)
WL2 inner side wall (side wall)
CW2 inner claw section (engaging section)
SU standing section (engaging section)
HG catching section
36 convex section (engaging section)
CS built-in chassis (housing)
WL3 thick side wall (side wall)
BG bulging section (engaging section)
1 FPC board (circuit board)
11 supply wiring
11M supply wiring for control (main supply wiring)
11MG supply wiring group for control (main supply wiring group)
11S supply wiring for checking (auxiliary supply wiring)
11SG supply wiring group for checking (auxiliary supply wiring group)
HL opening
41 liquid crystal display panel (display panel)
42 active matrix board
43 counter board
46 driver (control element)
47 driver wiring (element wiring)
47M control driver wiring (main element wiring)
47MG control driver wiring group (main element wiring group)
47S check driver wiring (auxiliary element wiring)
47SG check driver wiring group (auxiliary element wiring group)
49 liquid crystal display panel unit
MJ LED module
51 mounting board
52 LED
54 light guide plate
55 reflection sheet
59 backlight unit
69 liquid crystal display device (display device)
BR bending line
P direction of arrangement
Q direction of stack
R direction of intersection (direction of extension of bending line)
S1 first virtual plane

BEST MODES FOR CARRYING OUT THE INVENTION

Embodiment 1

An embodiment is described in the following with reference to the drawings. It is to be noted that, for the sake of convenience, hatching, numerals designating members, and the like may be omitted. In such a case, other drawings are to be referred to. On the other hand, hatching may be applied to drawings other than sectional drawings for the sake of convenience. Further, a black dot in a drawing denotes a direction perpendicular to a plane of the drawing.

It is to be noted that, although, in the following, a liquid crystal display device is described as an example of a display device, the present invention is not limited thereto. For example, the display device may be an organic electro-luminescence (EL) display or a plasma display. Further, various kinds of fastening tapes used in the liquid crystal display device are omitted for the sake of convenience.

Figure 2:
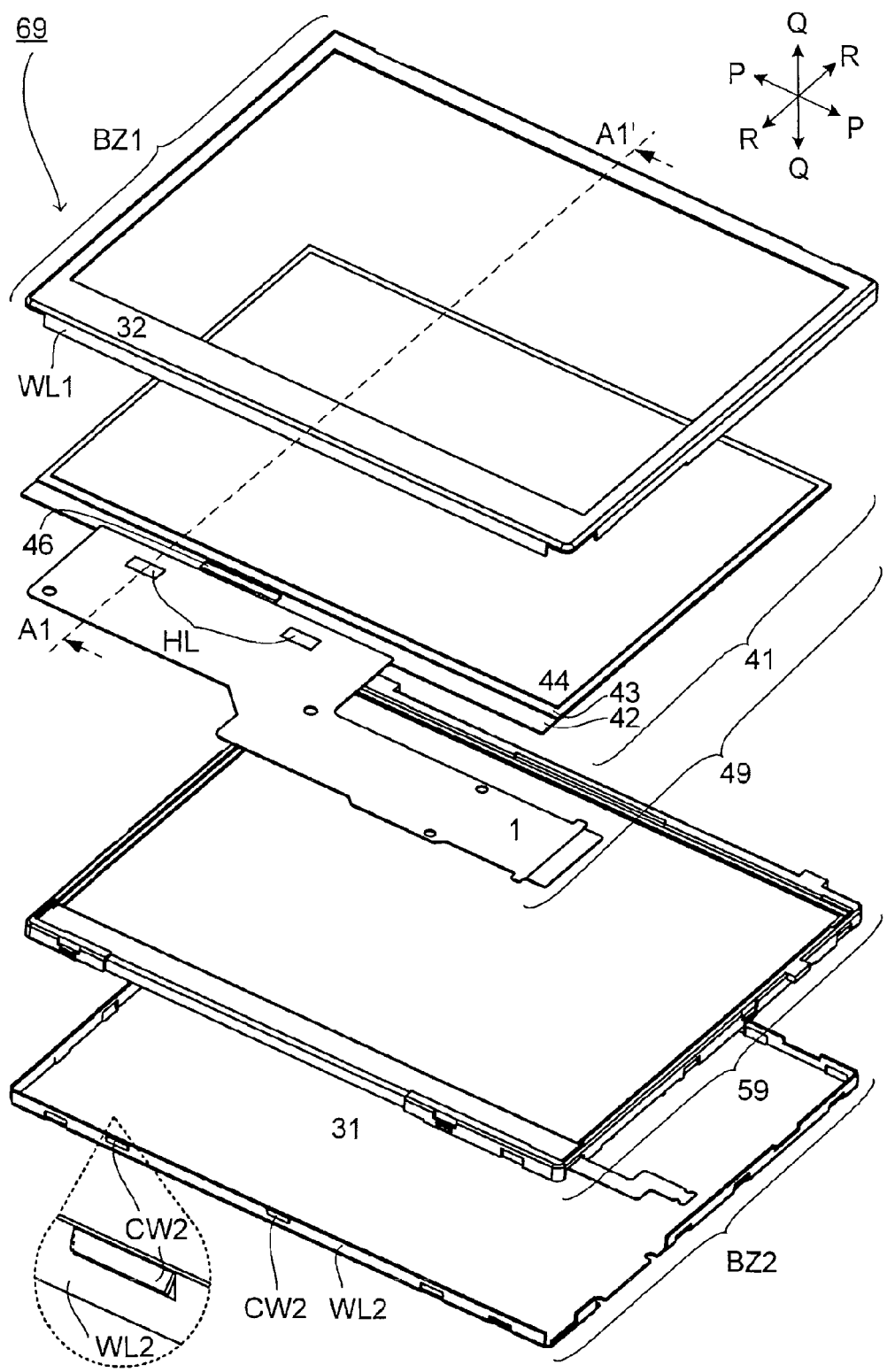
FIG. 2 is an exploded perspective view of a liquid crystal display device.
Figure 3:
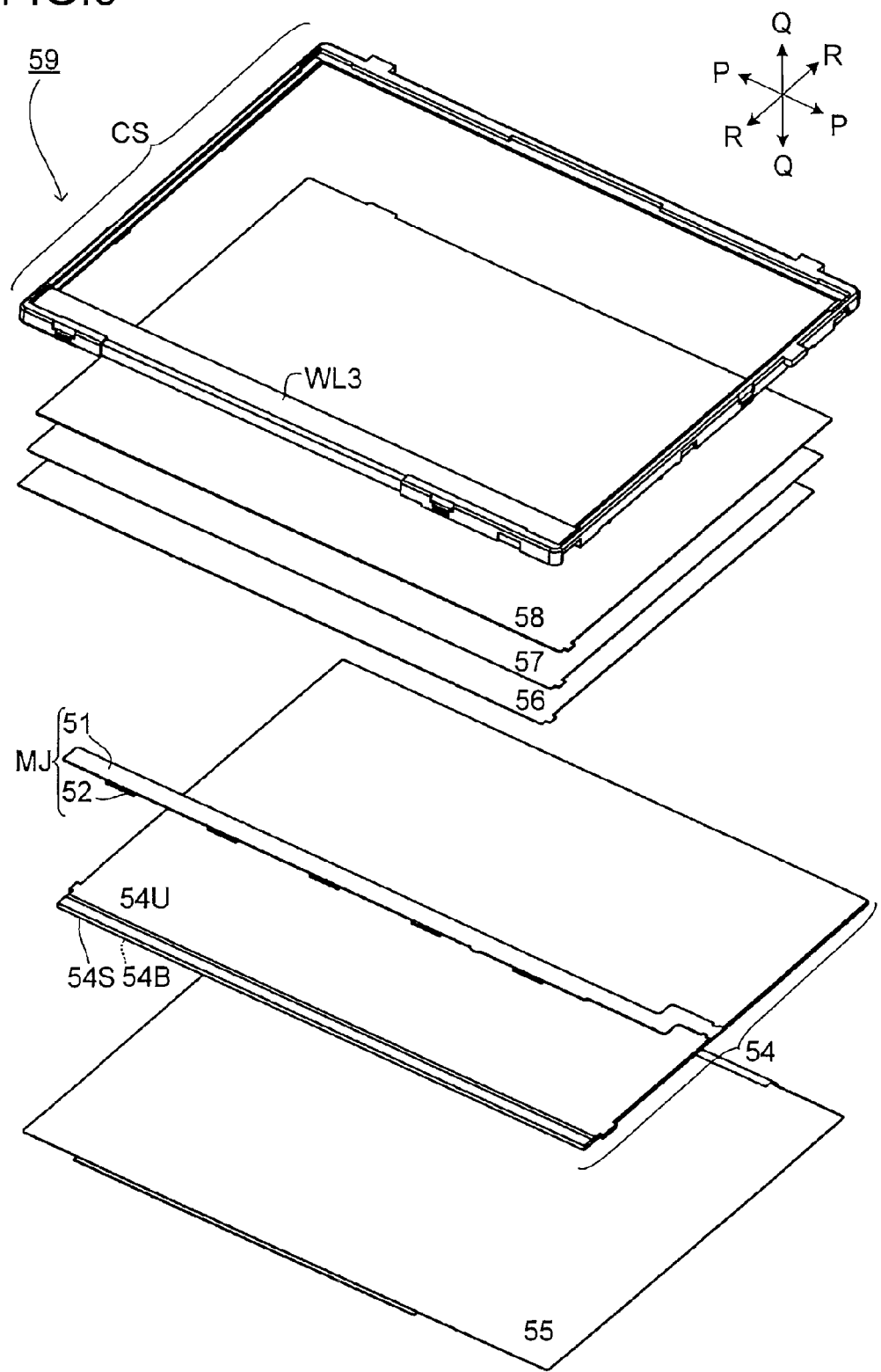
FIG. 3 is an exploded perspective view of a backlight unit included in the liquid crystal display device illustrated in FIG. 2.

A sectional view of FIG. 1 and an exploded perspective view of FIG. 2 illustrate a liquid crystal display device 69 (it is to be noted that the direction of a section of FIG. 1 is the arrows A1-A1' direction of FIG. 2). FIG. 3 is an exploded perspective view of a backlight unit 59 included in the liquid crystal display device 69.

As illustrated in FIG. 1 and FIG. 2, the liquid crystal display device 69 includes a liquid crystal display panel unit 49, the backlight unit 59, and bezels BZ (front bezel BZ1 and rear bezel BZ2) for holding the two units 49 and 59 by sandwiching the two units 49 and 59.

It is to be noted that the shape of the bezels BZ are not specifically limited. For example, it may be that, as illustrated in FIG. 2, the rear bezel BZ2 is a case for housing the two units 49 and 59 and the front bezel BZ1 is a frame which covers the rear bezel BZ2 (it is to be noted that the two bezels BZ1 and BZ2 may be referred to as housings in terms of holding a member).

The liquid crystal display panel unit 49 includes a liquid crystal display panel (display panel) 41 and a flexible printed circuit (FPC) board 1.

In the liquid crystal display panel 41, an active matrix board 42 including a switching element such as a thin film transistor (TFT) and a counter board 43 opposed to the active matrix board 42 are bonded together with a seal material (not shown). Liquid crystal (not shown) is injected between the two boards 42 and 43 (it is to be noted that polarizing films 44 and 44 are attached so as to sandwich the active matrix board 42 and the counter board 43).

The FPC board (circuit board) 1 is a board including supply wirings 11 (see FIG. 11 and the like to be described later) for passing current from a power supply (not shown), and is connected to the liquid crystal display panel 41. The supply wirings 11 of the FPC board 1 are, for example, connected to a driver (control element) 46 for controlling display of the liquid crystal display panel 41.

More specifically, the driver 46 is mounted near an end of the active matrix board 42 so as to be along the FPC board 1. Driver wirings 47 included in the driver 46 are connected to the supply wirings 11 of the FPC board 1 (see FIG. 11 and the like to be described later). It is to be noted that the place near the end of the active matrix board 42 on which the driver 46 is mounted is a portion of a surface of the active matrix board 42 opposed to the counter board 43 which is not covered with the counter board 43.

Figure 4:
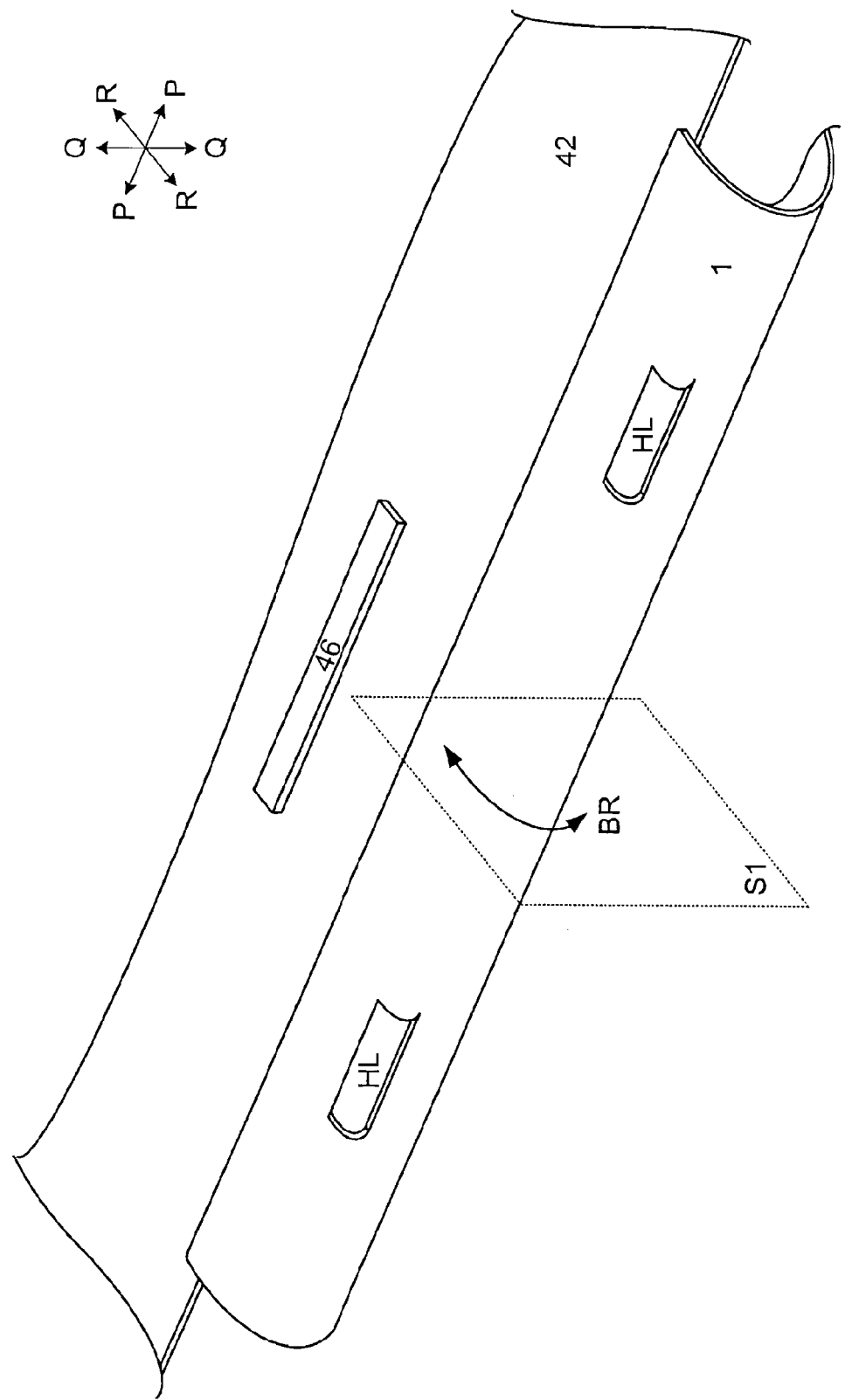
FIG. 4 is an enlarged perspective view of an FPC board.

Further, the ETC board 1 is a board having flexibility, and bends (curves), for example, as illustrated in FIG. 4. A line along the shape of the ETC board 1 which bends is hereinafter referred to as a bending line BR. A virtual plane which includes the bending line BR and intersects (intersects at right angles or the like) a board surface of the FPC board 1 is hereinafter referred to as a first virtual plane S1 (it is to be noted that the direction of a shortest way between the driver 46 and the FPC board 1 which is the direction of the side-by-side arrangement of the driver 46 and the FPC board 1 is equal to a direction R of intersection to be described later).

It is to be noted that the ETC board 1 includes openings HL. Details of the openings HL are described later.

The backlight unit 59 radiates light onto a non-emissive type liquid crystal display panel 41. More specifically, the liquid crystal display panel 41 has the function of displaying by receiving light from the backlight unit 59 (backlight light). Therefore, by radiating the entire surface of the liquid crystal display panel 41 with light from the backlight unit 59, the display quality of the liquid crystal display panel 41 is improved.

The backlight unit 59 includes, as illustrated in FIG. 3, an LED module MJ, a light guide plate 54, a reflection sheet 55, a diffusion sheet 56, optical sheets 57 and 58, and a built-in chassis CS.

The LED module MJ is a module which emits light, and includes a mounting board 51 and a light emitting diode (LED) 52 for emitting light by being supplied with current by being connected to electrodes formed on a mounting surface of the mounting board 51.

Further, it is preferred that the LED module MJ include a plurality of the LEDs (light emitting elements, dot-like light sources) 52 for the purpose of securing the amount of light. It is more preferred that the LEDs 52 be arranged side by side so as to form a line. However, in the figure, only part of the LEDs 52 are illustrated for the sake of convenience (it is to be noted that the direction of the arrangement of the LEDs 52 is hereinafter referred to as a direction P of arrangement).

The light guide plate 54 is a plate-like member having side surfaces 54S and a top surface 54U and a bottom surface 54B which are positioned so as to sandwich the side surfaces 54S. One of the side surfaces 54S (light receiving surface) faces light emitting surfaces of the LEDs 52 and receives light from the LEDs 52. The received light is mixed in the light guide plate 54 into planar light to be emitted from the top surface 54U to the outside.

The reflection sheet 55 is positioned so as to be covered with the light guide plate 54. A surface of the reflection sheet 55 which faces the bottom surface 54B of the light guide plate 54 is a reflecting surface. Therefore, the reflecting surface reflects light from the LEDs 52 and light which propagates through the light guide plate 54 such that the light is returned into the light guide plate 54 (more specifically, through the bottom surface 54B of the light guide plate 54) without leakage.

The diffusion sheet 56 is positioned so as to cover the top surface 54U of the light guide plate 54, and diffuses planar light from the light guide plate 54 such that the light is distributed across the liquid crystal display panel 41 (it is to be noted that the diffusion sheet 56 and the optical sheets 57 and 58 are also collectively referred to as an optical sheet group).

The optical sheets 57 and 58 are optical sheets which have, for example, prism shapes within sheet surfaces for polarizing emission characteristics of light and are positioned so as to cover the diffusion sheet 56. Therefore, the optical sheets 57 and 58 condense light which travels from the diffusion sheet 56 to improve the brightness. It is to be noted that the direction of the spread of light condensed by the optical sheet 57 and the direction of the spread of light condensed by the optical sheet 58 intersect each other.

The built-in chassis CS is a frame-like base (frame edge) for holding the various members described above (it is to be noted that the built-in chassis CS may be referred to as a housing in terms of holding members). More specifically, the built-in chassis CS stacks and holds the reflection sheet 55, the light guide plate 54, the diffusion sheet 56, and the optical sheets 57 and 58 in this order (it is to be noted that the direction of the stack is hereinafter referred to as a direction Q of stack, and a direction perpendicular to (a direction which intersects) both the direction P of arrangement and the direction Q of stack is hereinafter referred to as the direction R of intersection).

In the backlight unit 59 described above, light from the LEDs 52 becomes planar light by the light guide plate 54 to be emitted, and the planar light becomes backlight light the brightness of which is enhanced by passing through the optical sheet group to be emitted. The backlight light reaches the liquid crystal display panel 41, and, by the backlight light, the liquid crystal display panel 41 displays an image.

Here, the rear bezel BZ2 and the front bezel BZ1 and the openings HL included in the FPC board 1 are described in detail.

As illustrated in FIG. 1 and FIG. 2, the rear bezel BZ2 is a case having a bottom surface 31 and a side wall WL (inner side wall WL2) which rises from an outer edge of the bottom surface 31, and houses the backlight unit 59. On the other hand, the front bezel BZ1 is a frame having a frame surface 32 and a side wall WL (outer side wall WL1) which rises from an outer edge of the frame surface 32, and covers the rear bezel BZ2 to be a lid of the rear bezel BZ2.

Therefore, the outer shape of the front bezel BZ1 is slightly larger than the outer shape of the rear bezel BZ2 (it is to be noted that the outer shape as used herein refers to a loop-like shape created by connecting the side walls WL1 and WL2 at the bezels BZ1 and BZ2). Therefore, when the front bezel BZ1 becomes the lid of the rear bezel BZ2, an inside of the outer side wall WL1 and an outside of the inner side wall WL2 face each other.

The two bezels BZ1 and BZ2 engage with each other for the purpose of sandwiching and holding the liquid crystal display panel unit 49 and the backlight unit 59 (in short, the two bezels BZ1 and BZ2 sandwich the two units 49 and 59 and are integrated).

Thus, claw sections CW (CW1 and CW2) engaging with each other are formed on the front bezel BZ1 and the rear bezel BZ2, respectively. More specifically, among the claw sections (engaging sections) CW1 and CW2 for, by engaging with each other, integrating the front bezel BZ1 and the rear bezel BZ2, the claw sections (outer claw sections) CW1 are included in the front bezel BZ1 while the claw sections (inner claw sections) CW2 are included in the rear bezel BZ2 (it is to be noted that the front bezel BZ1 and the rear bezel BZ2 to be integrated may be referred to as a housing unit).

The outer claw sections CW1 are formed of square-bracket-like (in the shape of [ ]) cut portions of the outer side wall WL1, while the inner claw sections CW2 are formed of square-bracket-like (in the shape of [ ]) cut portions of the inner side wall WL2.

More specifically, as illustrated in FIG. 1, the outer claw sections CW1 are completed by positioning leading edges and trailing edges of the cuts on the side of a distal end of the outer side wall WL1 and causing the cut portions to stand toward the inside of the outer side wall WL1. Further, as illustrated in FIG. 1 and FIG. 2, the inner claw sections CW2 to engage with the outer claw sections CW1 are completed by positioning leading edges and trailing edges of the cuts on the side of a distal end of the inner side wall WL2 and causing the cut portions to stand toward the outside of the inner side wall WL2.

With the above-mentioned structure, when the front bezel BZ1 becomes the lid of the rear bezel BZ2, the outer claw sections CW1 positioned inside the outer side wall WL1 and the inner claw sections CW2 positioned outside the inner side wall WL2 face each other.

However, even when the outer claw sections CW1 and the inner claw sections CW2 are opposed to each other so as to engage with each other, if an obstacle which prevents the engagement (that is, the FPC board 1) exists between the two claw sections CW1 and CW2, the front bezel BZ1 and the rear bezel BZ2 are not integrated by the engagement between the outer claw sections CW1 and the inner claw sections CW2.

Therefore, the openings HL which do not prevent the engagement between the outer claw sections CW1 and the inner claw sections CW2 are formed in the FPC board 1. More specifically, the openings HL which permit entry of the outer claw sections CW1 and the inner claw sections CW2 therethrough are formed in the FPC board 1.

By the existence of the openings HL, the two bezels BZ1 and BZ2 hold the backlight unit 59 and the liquid crystal display panel unit 49 as, for example, in the following.

First, the rear bezel BZ2 houses the backlight unit 59. The liquid crystal display panel unit 49 covers the built-in chassis CS in the backlight unit 59 (more specifically, the built-in chassis CS supports a surface of the active matrix board 42 which is farthest from the counter board 43).

The FPC board 1 included in the liquid crystal display panel unit 49 bends, as illustrated in FIG. 1, so as to cover the outside of the inner side wall WL2 of the rear bezel BZ2, and further, so as to also cover the bottom surface 31 of the rear bezel BZ2. In other words, the FPC board 1 winds around the inner side wall WL2 and the bottom surface 31 of the rear bezel BZ2 so as to cover the inner side wall WL2 and the bottom surface 31.

In the FPC board 1 which bends in this way, the openings HL are positioned at places opposed to the inner claw sections CW2 of the inner side wall WL2. Then, the inner claw sections CW2 project to the outside through the openings HL. When the front bezel BZ1 covers the rear bezel BZ2, the outer claw sections CW1 on the outer side wall WL1 are opposed to the inner claw sections CW2 which project through the openings HL.

As a result, the outer claw sections CW1 and the inner claw sections CW2 which are opposed to each other engage with each other with the openings HL therebetween. In other words, in the front bezel BZ1 and the rear bezel BZ2 (which are also referred to as an electronic package) on which the FPC board 1 is to be mounted, the outer claw sections CW1 of the front bezel BZ1 and the inner claw sections CW2 of the rear bezel BZ2 engage with each other through the openings HL in the FPC board 1.

With the above-mentioned structure, the outer claw sections CW1 and the inner claw sections CW2 are not required to be positioned so as not to interfere with the FPC board 1. More specifically, the outer claw sections CW1 are not positioned on a portion of the outer side wall WL1 which is not opposed to the FPC board 1, and the inner claw sections CW2 are not positioned on a portion of the inner side wall WL2 which is not opposed to the FPC board 1.

Therefore, insofar as the positional relationship between the outer claw sections CW1 and the inner claw sections CW2 is such that the outer claw sections CW1 and the inner claw sections CW2 engage with each other, the outer claw sections CW1 and the inner claw sections CW2 may be positioned anywhere on the outer side wall WL1 and the inner side wall WL2, respectively, without being restrained by the FPC board 1 (in short, the degree of flexibility in positioning the claw sections CW is improved).

By way of example, the claw sections CW (CW1 and CW2) may be positioned on side walls WL (WL1 and WL2) which face each other along a short side direction of the bezels BZ (BZ1 and BZ2) so as to face each other along the short side direction. Of course, the claw sections CW (CW1 and CW2) may be positioned on the side walls WL (WL1 and WL2) which face each other along a long side direction of the bezels BZ (BZ1 and BZ2) so as to face each other along the long side direction.

With the above-mentioned structure, because the positions at which the two bezels BZ1 and BZ2 engage with each other are opposed with regard to each direction (along the long side direction and the short side direction of the bezels BZ), engaging force is appropriately applied to the two bezels BZ1 and BZ2 to firmly integrate the front bezel BZ1 and the rear bezel BZ2.

Further, the claw sections CW (CW1 and CW2) may be positioned at the midpoint in the long side of the side walls WL (WL1 and WL2). Even if the structure is as described above, engaging force is appropriately applied to the two bezels BZ1 and BZ2, and the front bezel BZ1 and the rear bezel BZ2 are firmly integrated.

Further, because the inner claw sections CW2 covered with the FPC board 1 appear to the outside through the openings HL, when the front bezel BZ1 covers the rear bezel BZ2, a user sees the inner claw sections CW2 (in short, the inner claw sections CW2 become marks). Therefore, it is easier to align the outer claw sections CW1 with the inner claw sections CW2, and hence the manufacturing efficiency may be improved (it is to be noted that a side surrounded by the FPC board 1 is referred to as the inside while a side opposite to the inside is referred to as the outside).

Further, as illustrated in FIG. 1, a side to which the outer claw sections CW1 extend and a side to which the inner claw sections CW2 extend correspond to sides on which the front bezel BZ1 and the rear bezel BZ2 are away from each other, respectively. More specifically, the outer claw sections CW1 extend to a side on which the front bezel BZ1 is away from the rear bezel BZ2, while the inner claw sections CW2 extend to aside on which the rear bezel BZ2 is away from the front bezel BZ1.

With the above-mentioned structure, as the front bezel BZ1 and the rear bezel BZ2 struggle to move farther away from each other, the outer claw sections CW1 and the inner claw sections CW2 more firmly engage with each other. Therefore, the extent of the engagement between the front bezel BZ1 and the rear bezel BZ2 (the strength as a housing unit) is increased.

Figure 5:
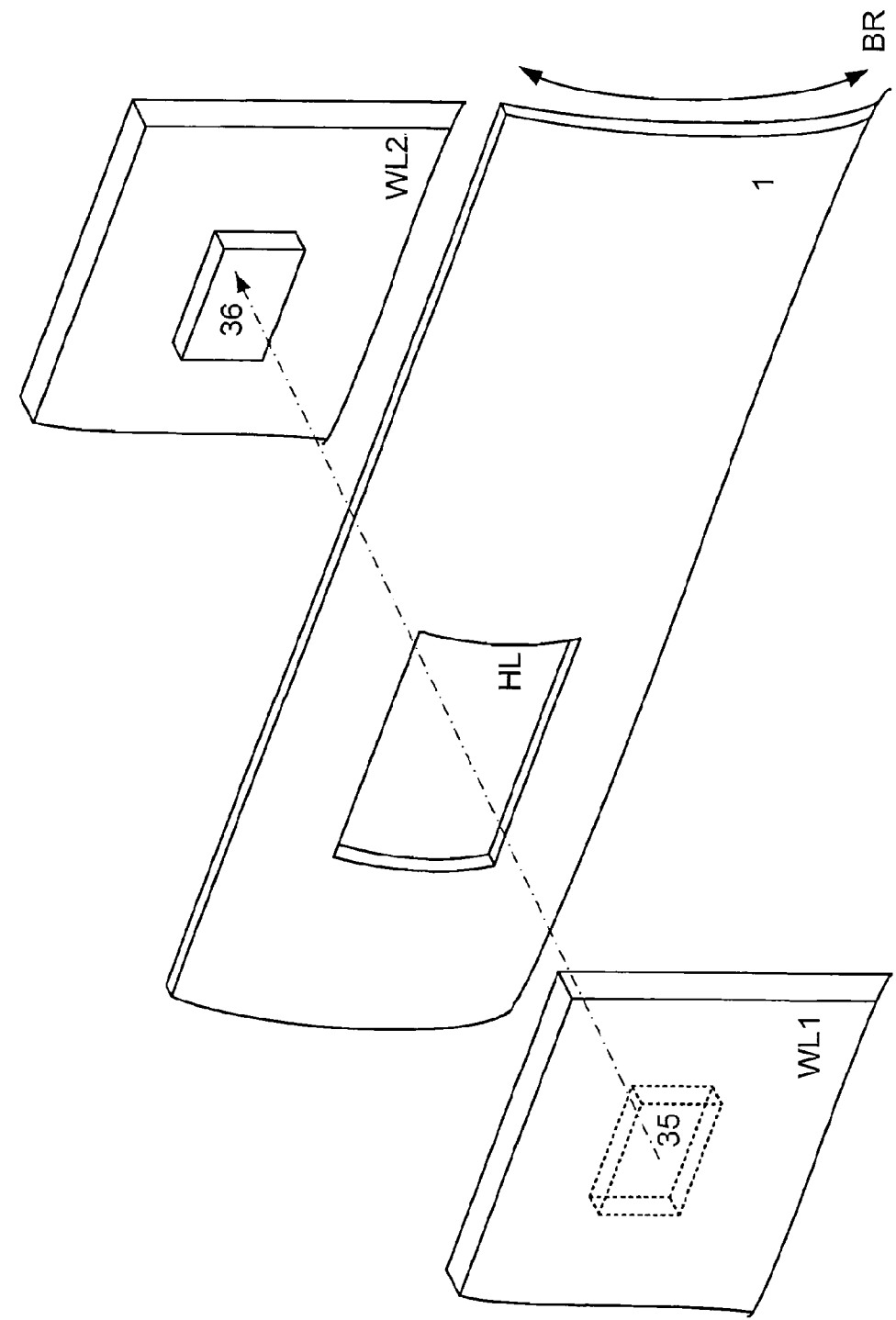
FIG. 5 is a perspective view of an outer side wall of a front bezel, an FPC board, and an inner side wall of a rear bezel which are extracted.

It is to be noted that the shapes of the claw sections CW are not limited thereto, and claw sections CW in other shapes may also be possible. For example, as illustrated in FIG. 5 which is a perspective view of the outer side wall WL1, the FPC board 1, and the inner side wall WL2 that are extracted, a concave section 35 which is recessed from the inside of the outer side wall WL1 and a convex section 36 which bulges from the outside of the inner side wall WL2 may be the engaging sections. In other words, the convex section 36 may fit into the concave section 35 with the opening HL therebetween.

Even if the structure is as described above, the convex section 36 of the inner side wall WL2 projects to the outside through the opening HL to fit into the concave section 35 of the outer side wall WL1. Therefore, the concave section 35 may be positioned anywhere in the outer side wall WL1 and the convex section 36 may be positioned anywhere on the inner side wall WL2 without being restrained by the FPC board 1 (in short, the degree of flexibility in positioning the concave section 35 and the convex section 36 which fits into the concave section 35 is improved).

Further, although the concave section 35 does not pass through the opening HL, because the convex section 36 covered with the FPC board 1 appears to the outside through the opening HL, when the front bezel BZ1 covers the rear bezel BZ2, a user sees the convex section 36 (in short, the convex section 36 becomes a mark). Therefore, it is easier to align the concave section 35 with the convex section 36, and hence the manufacturing efficiency may be improved.

In addition, the sum of the thickness of the outer side wall WL1 and the thickness of the inner side wall WL2 (frame portion) becomes thinner by the amount by which the convex section 36 is housed in the concave section 35, and the frame of the backlight unit 59 can be made narrower.

It is to be noted that, as illustrated in FIG. 1, the two claw sections CW1 and CW2 engage with each other with the outer claw sections CW1 entering the openings HL from one board surface of two board surfaces of the FPC board 1 which are opposed to each other and the inner claw sections CW2 entering the openings HL from the other board surface of the FPC board 1. However, the present invention is not limited thereto.

For example, as illustrated in FIG. 5, it may be that the convex section 36 fits into the concave section 35 with the concave section 35 not entering the opening HL from the one board surface of the two board surfaces of the FPC board 1 which are opposed to each other and the convex section 36 entering the opening HL from the other board surface of the FPC board 1 (in short, it is enough that at least one of the engaging sections which engage with each other passes through the opening HL).

In particular, when, as illustrated in FIG. 1 and FIG. 5, the engaging sections (the inner claw sections CW2 and the convex section 36) enter the openings HL from the inside to the outside of the FPC board 1 which winds and bends, the engaging sections are visible to a user, and hence the manufacturing efficiency of the liquid crystal display device 69 may be improved, which is, thus, preferred.

However, the present invention is not limited thereto, and the engaging sections may enter the openings HL from the outside to the inside of the FPC board 1 (for example, the engaging section shown by a number 36 in FIG. 5 may be a concave section and the engaging section shown by a number 35 may be a convex section). The reason is that, even if the structure is as described above, because the opening HL covering the engaging section is a mark, when the front bezel BZ1 covers the rear bezel BZ2, it is easier to align another engaging section with the engaging section, and hence the manufacturing efficiency of the liquid crystal display device 69 may be improved.

Embodiment 2

Embodiment 2 is described. It is to be noted that like reference symbols are used to designate members having similar functions to those used in Embodiment 1 and description thereof is omitted.

In Embodiment 1, first, the rear bezel BZ2 houses the backlight unit 59, and the liquid crystal display panel unit 49 covers the built-in chassis CS in the backlight unit 59. The FPC board 1 bends so as to cover the outside of the inner side wall WL2 of the rear bezel BZ2, and further, bends so as to also cover the bottom surface 31 of the rear bezel BZ2. However, the present invention is not limited thereto.

Figure 6:
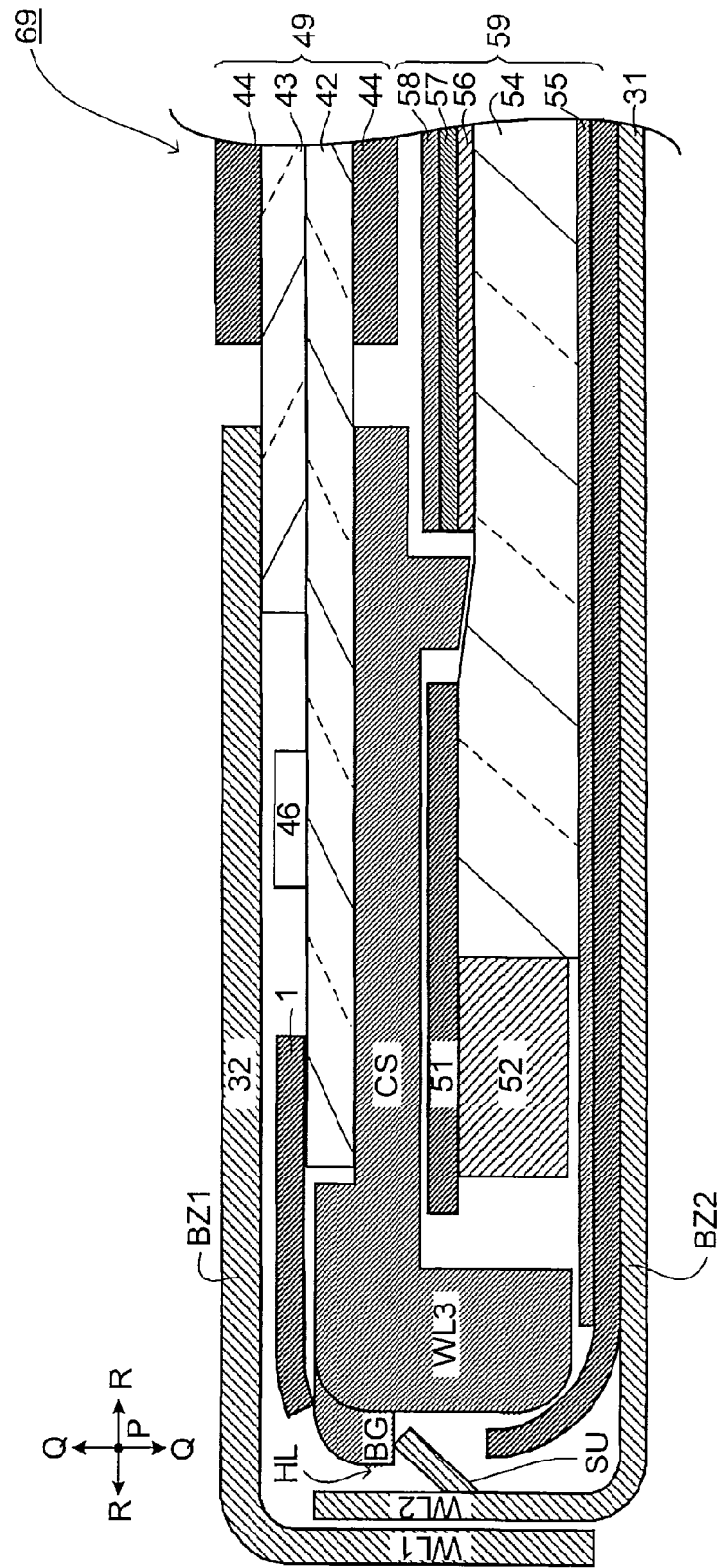
FIG. 6 is a sectional view taken in the arrows A2-A2' direction of a liquid crystal display device illustrated in FIG. 7.

For example, it may be that, first, the liquid crystal display panel unit 49 covers the built-in chassis CS of the backlight unit 59, and the FPC board 1 bends so as to cover the outside of a side wall WL (thick side wall WL3) which is thick in the built-in chassis CS, and further, bends so as to also cover the reflection sheet 55 (in other words, the FPC board 1 winds around the thick side wall WL3 of the built-in chassis CS and the reflection sheet 55 so as to cover the thick side wall WL3 of the built-in chassis CS and the reflection sheet 55, see a sectional view of FIG. 6 to be described later).

In such a case, the backlight unit 59 and the liquid crystal display panel unit 49 are housed in the rear bezel BZ2 with the FPC board 1 being bent, and after that, the front bezel BZ1 covers the rear bezel BZ2. In this case, the FPC board 1 is not sandwiched between the outer side wall WL1 of the front bezel BZ1 and the inner side wall WL2 of the rear bezel BZ2. Therefore, the members which pass through the openings HL (the two claw sections CW1 and CW2, the engaging sections) are different from those in the case of Embodiment 1.

Figure 7:
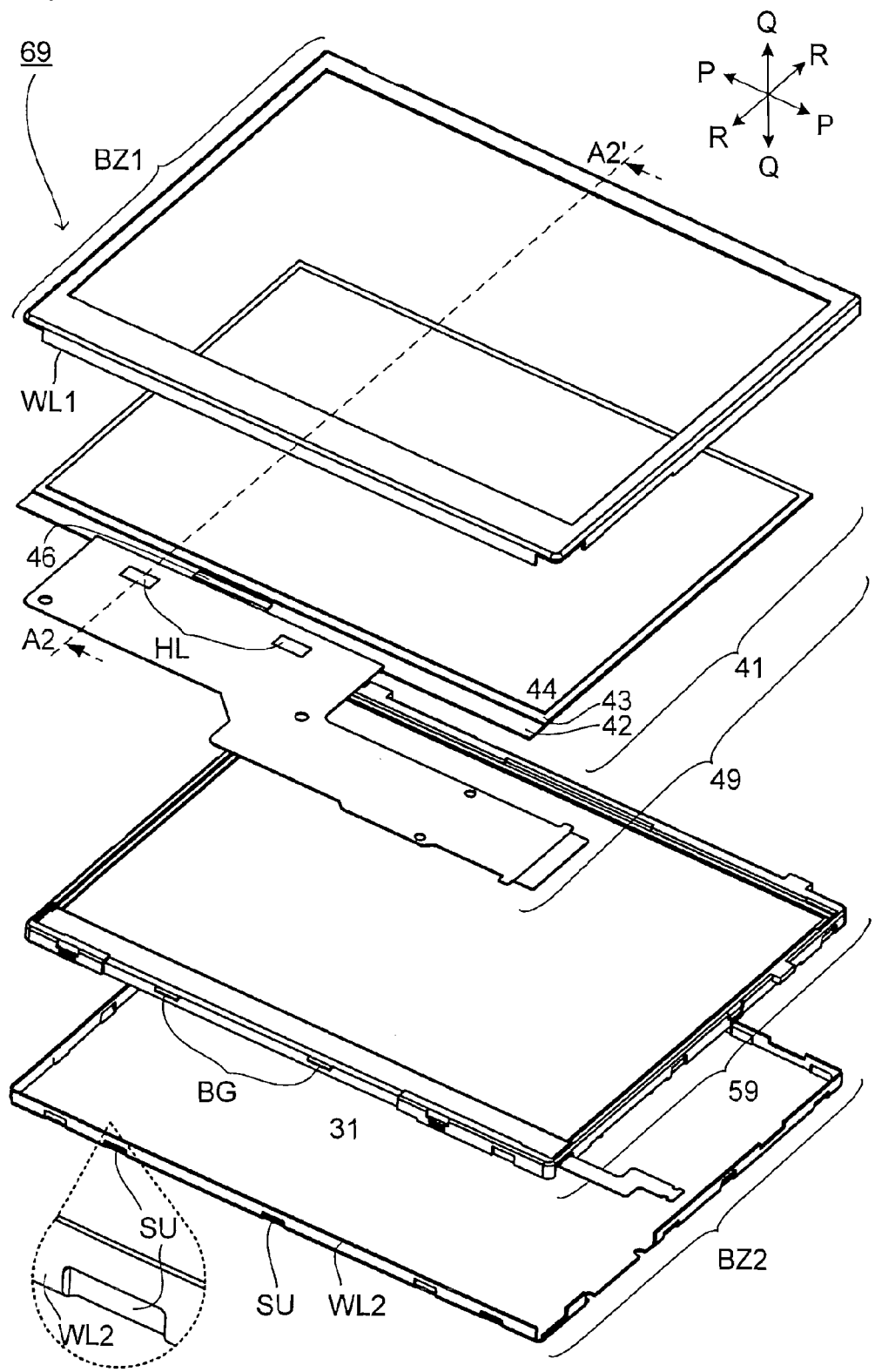
FIG. 7 is an exploded perspective view of a liquid crystal display device which is different from that illustrated in FIG. 2.
Figure 8:
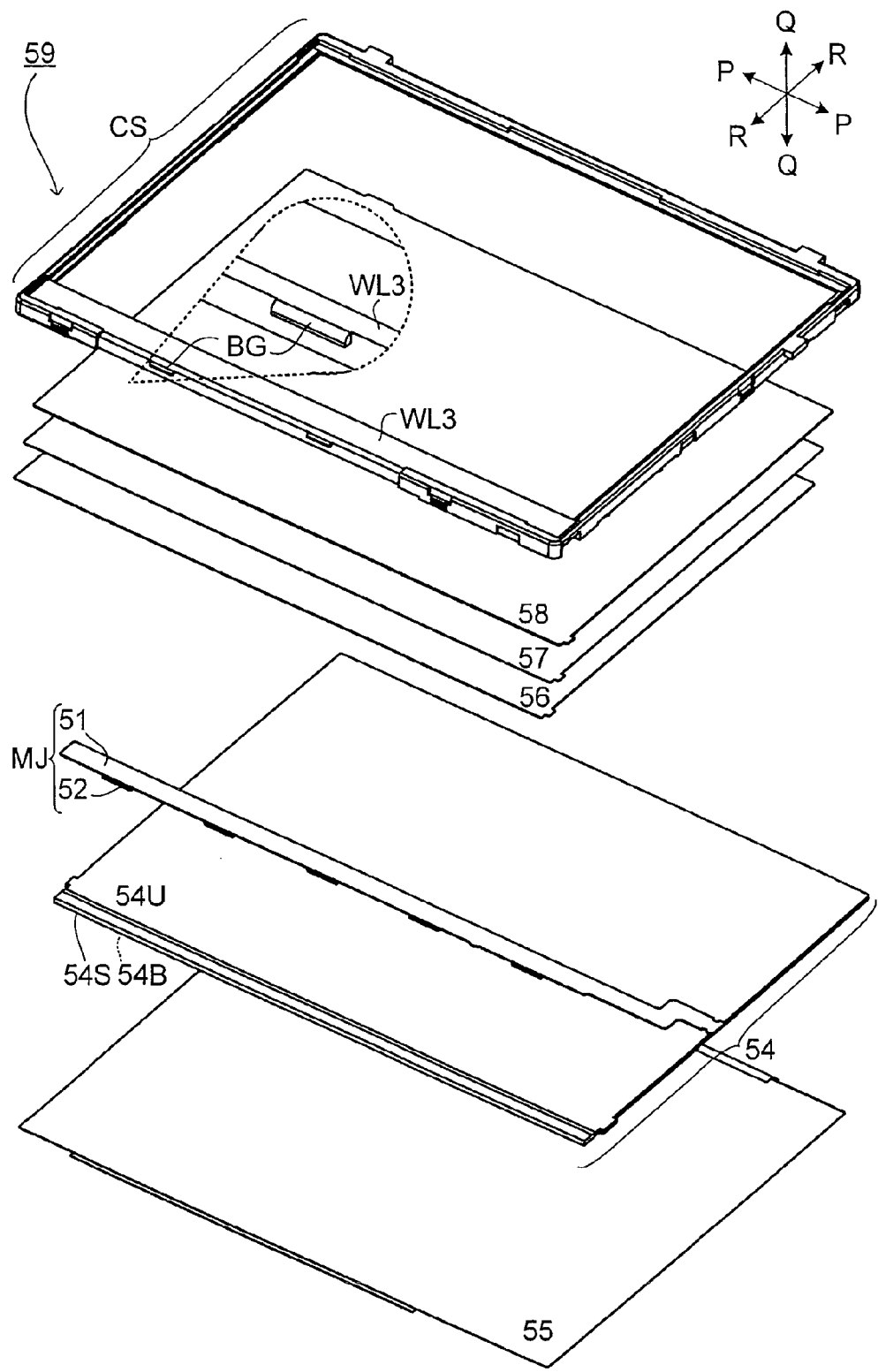
FIG. 8 is an exploded perspective view of a backlight unit included in the liquid crystal display device illustrated in FIG. 7.

In Embodiment 2, the members which pass through the openings HL and which are different from those in Embodiment 1 are described with reference to FIG. 6 to FIG. 8. It is to be noted that a sectional view of FIG. 6 and an exploded perspective view of FIG. 7 illustrate the liquid crystal display device 69 (it is to be noted that the direction of a section in FIG. 6 is the arrows A2-A2' direction of FIG. 7). FIG. 8 is an exploded perspective view of the backlight unit 59 included in the liquid crystal display device 69.

As illustrated in FIG. 6, the FPC board 1 bends so as to cover the outside of the thick side wall WL3 in the built-in chassis CS, and further, so as to also cover the reflection sheet 55. Therefore, when the backlight unit 59 and the liquid crystal display panel unit 49 are housed in the rear bezel BZ2, the inner side wall WL2 of the rear bezel BZ2 and the thick side wall WL3 of the built-in chassis CS sandwich the FPC board 1 (in other words, the inner side wall WL2 and the thick side wall WL3 are opposed to each other).

When the rear bezel BZ2 and the built-in chassis CS are integrated by causing the rear bezel BZ2 and the built-in chassis CS to engage with each other, it is preferred that the openings HL be at positions at which the engaging sections formed on the rear bezel BZ2 and on the built-in chassis CS pass therethrough, for example, at positions at which the openings HL are sandwiched between the inner side wall WL2 of the rear bezel BZ2 and the thick side wall WL3 of the built-in chassis CS (in short, it is preferred that, when the liquid crystal display panel unit 49 is supported by the built-in chassis CS, the openings HL be positioned at places at which the openings HL are opposed to the thick side wall WL3).

Among the engaging sections which engage with each other through the openings HL (standing sections SU and bulging sections BC), the standing sections SU are formed inside the inner side wall WL2 of the rear bezel BZ2 while the bulging sections BG are formed outside the thick side wall WL3 of the built-in chassis CS.

With the above-mentioned structure, when the backlight unit 59 with the thick side wall WL3 and the reflection sheet 55 thereof being covered with the FPC board 1 which bends is housed in the rear bezel BZ2, the bulging sections BG of the built-in chassis CS are opposed to the standing sections SU of the rear bezel BZ2 through the openings HL.

As a result, the bulging sections BG and the standing sections SU which are opposed to each other engage with each other through the openings HL. In other words, in the rear bezel BZ2 and the built-in chassis CS (which are also referred to as an electronic package) on which the FPC board 1 is to be mounted, the standing sections SU of the rear bezel BZ2 and the bulging sections BG of the built-in chassis CS engage with each other while sandwiching the openings HL in the FPC board 1.

With the above-mentioned structure, because the openings HL are between the standing sections SU and the bulging sections BG, the standing sections SU and the bulging sections BG are not positioned so as not to interfere with the FPC board 1. More specifically, the standing sections SU are not positioned on a portion of the inner side wall WL2 which is not opposed to the FPC board 1, and the bulging sections BG are not positioned on a portion of the thick side wall WL3 which is not opposed to the FPC board 1.

Therefore, insofar as the positional relationship between the standing sections SU and the bulging sections BG is such that the standing sections SU and the bulging sections BG engage with each other, the standing sections SU and the bulging sections BG may be positioned anywhere on the inner side wall WL2 and the thick sidewall WL3, respectively (in short, the degree of flexibility in positioning the standing sections SU and the bulging sections BG is improved).

By way of example, the standing sections SU may be positioned on the inner side wall WL2 facing each other along a short side direction of the rear bezel BZ2 so as to face each other along the short side direction (it is to be noted that, correspondingly to this, the bulging sections BG are positioned on the thick side wall WL3 facing each other along a short side direction of the built-in chassis CS so as to face each other along the short side direction).

Of course, the standing sections SU may be positioned on the inner side wall WL2 facing each other along a long side direction of the rear bezel BZ2 so as to face each other along the long side direction (it is to be noted that, correspondingly to this, the bulging sections BG are positioned on the thick side wall WL3 facing each other along a long side direction of the built-in chassis CS so as to face each other along the long side direction).

With the above-mentioned structure, because the positions at which the rear bezel BZ2 and the built-in chassis CS engage with each other are opposed with regard to each direction (along the long side direction and the short side direction of the rear bezel BZ2), the rear bezel BZ2 and the built-in chassis CS are firmly integrated.

It is preferred to complete the standing sections SU by, as illustrated in FIG. 6 and FIG. 7, positioning leading edges and trailing edges of the square-bracket-like (in the shape of [) cuts of the inner side wall WL2 on the side of a proximal end of the inner side wall WL2 (in short, the bezels BZ) and causing the cut portions to stand toward inside of the inner side wall WL2. However, the present invention is not limited thereto, and standing sections SU in other shapes may also be possible (for example, the shape may be like the bulging sections BG).

On the other hand, it is preferred to form the bulging sections BG which engage with the standing sections SU by, as illustrated in FIG. 6 and FIG. 8, bulging part of the outside of the thick side wall WL3. However, the present invention is not limited thereto, and bulging sections BG in other shapes may also be possible (for example, the shape may be like the standing sections SU).

Embodiment 3

Embodiment 3 is described. It is to be noted that like reference symbols are used to designate members having similar functions to those used in Embodiments 1 and 2 and description thereof is omitted.

Usually, when the FPC board 1 bends, the FPC board 1 exerts force to return to an original shape thereof (resilience). The resilience can be a cause of, for example, positional displacement of various members connected to the FPC board 1. Therefore, as an idea for suppressing various kinds of adverse effects caused by the resilience of the FPC board 1, catching sections HG as illustrated in an enlarged sectional view of FIG. 9 may be formed on the inner side wall WL2 of the rear bezel BZ2.

The catching sections HG are, similarly to the inner claw sections CW2, formed of square-bracket-like (in the shape of [) cut portions of the inner side wall WL2. More specifically, the catching sections HG are completed by forming cuts so as to be arranged immediately below the inner claw sections CW2 (on the side of the bottom surface 31) along the direction of rising of the inner side wall WL2, positioning leading edges and trailing edges of the cuts on the side of the inner claw sections CW2, and causing the cut portions to stand toward the outside of the inner side wall WL2.

By causing the catching sections HG to catch on edges of the openings HL, the FPC board 1 becomes unmovable with respect to the rear bezel BZ2 and the front bezel BZ1. Further, as the FPC board 1 becomes unmovable, members connected to the FPC board 1, for example, the liquid crystal display panel 41, also become unmovable.

When the liquid crystal display panel 41 becomes unmovable, manufacture of various kinds of electronic devices having the liquid crystal display device 69 mounted thereon (for example, a notebook personal computer, a cellular telephone, and a personal digital assistant (PDA)) becomes easier, and the quality of the manufactured electronic devices is improved.

More specifically, when the liquid crystal display panel 41 becomes unmovable without floating over the built-in chassis CS, the electronic device can be manufactured without the necessity of taking into consideration the floating of the liquid crystal display panel 41, and thus, the manufacture is easier. Further, because a situation in which the liquid crystal display panel 41 can not appropriately receive backlight light due to the floating of the liquid crystal display panel 41 over the built-in chassis CS (by extension, over the backlight unit 59) does not occur, the image quality of the liquid crystal display device 69 is secured (for example, uneven brightness is suppressed).

Further, when the LED module MJ is connected to the FPC board 1, if the FPC board 1 is unmovable, the LED module MJ is also unmovable. Therefore, for example, a situation in which the incident angle on the light guide plate 54 changes due to the positional displacement of the LED module MJ from a predetermined position does not occur. Therefore, uneven brightness of the liquid crystal display device 69 is suppressed.

Figure 10:
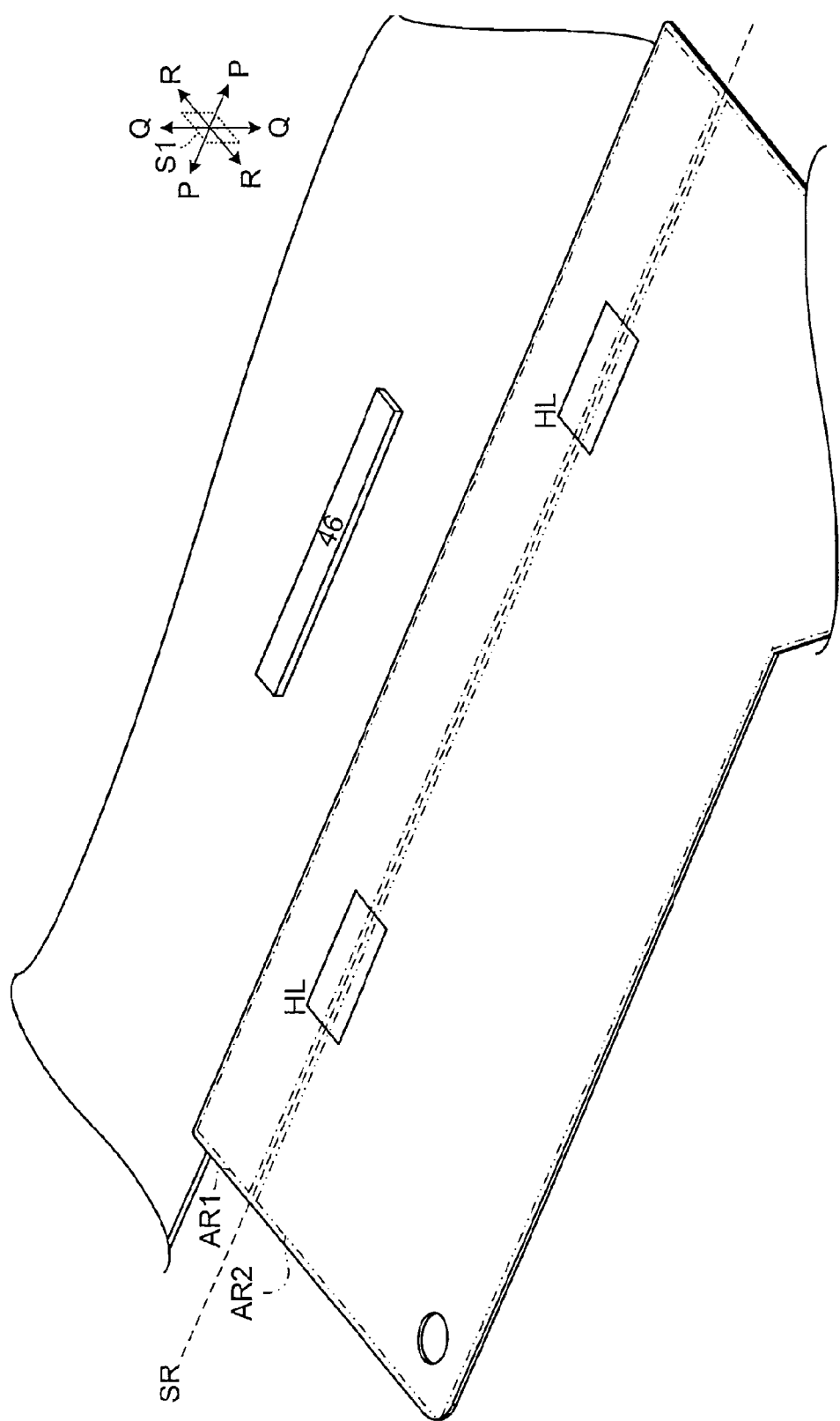
FIG. 10 is a partially enlarged perspective view of a portion around openings in the FPC board.

By the way, the direction of extension of the bending line BR illustrated in FIG. 4 is, in FIG. 10 illustrating the FPC board 1 on a plane, the same as the direction R of intersection (in short, the bending line BR assumed with regard to the ETC board 1 which bends becomes a straight line with regard to the FTC board 1 on a plane).

Then, the board surface of the ETC board 1 on a plane the direction of which is the same as that of a surface of the active matrix board 42 is equal to a virtual plane which includes the direction R of intersection and the direction P of arrangement, and the first virtual plane S1 is equal to a virtual plane which includes the direction R of intersection and the direction Q of stack.

Figure 9:
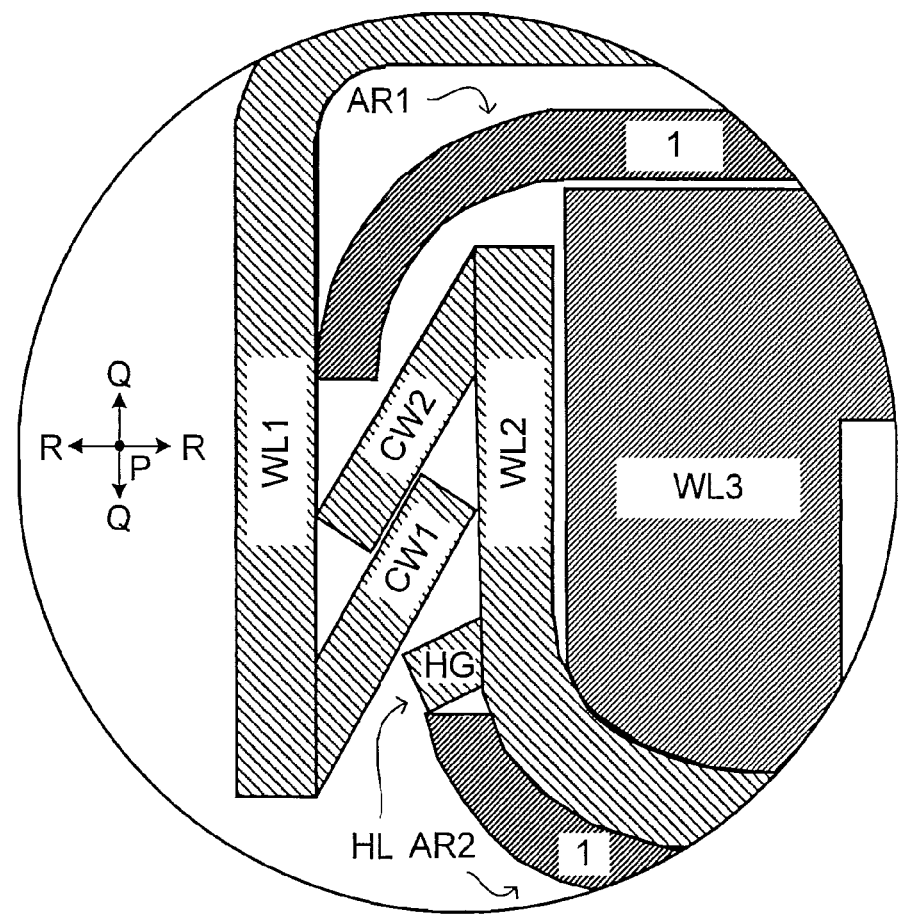
FIG. 9 is an enlarged sectional view of another example of the liquid crystal display device illustrated in FIG. 1.

As illustrated in FIG. 10, provided that a line which intersects at right angles (intersects) the first virtual plane S1 is hereinafter referred to as a dividing line SR, the FPC board 1 is divided into two according to the dividing line SR which passes through the openings HL. Further, one of portions of the divided FPC board 1 having a smaller area is hereinafter referred to as a small area region AR1 while the other of the portions of the divided FPC board 1 having a larger area is hereinafter referred to as a large area region AR2. In this case, as illustrated in FIG. 9, the catching sections HG pulls the portion of the FPC board 1 which is the small area region AR1 toward the portion of the FPC board 1 which is the large area region AR2.

This is because, when the FPC board 1 bends, the portion of the FPC board 1 which is the small area region AR1 tries to, by resilience, move by a relatively large amount with respect to the portion of the FPC board 1 which is the large area region AR2. Therefore, the catching sections HG pulls the portion of the FPC board 1 which is the small area region AR1 toward the portion of the FPC board 1 which is the large area region AR2 by catching on the edges of the openings HL on the side of the large area region AR2.

It is to be noted that, in order to catch on the edges of the openings HL on the side of the large area region AR2, it is preferred that the catching sections HG be as follows. That is, it is preferred that, when the catching sections HG are within the openings HL, the direction of extension of the catching sections HG is toward the portion of the FPC board 1 which is the large area region AR2.

With the above-mentioned structure, as the portion of the FPC board 1 which is the small area region AR1 struggles to move more with respect to the portion of the FPC board 1 which is the large area region AR2, the catching sections HG and the edges of the openings HL more firmly engage with each other. As a result, the catching sections HG pull without fail the portion of the FPC board 1 which is the small area region AR1 toward the portion of the FPC board 1 which is the large area region AR2.

It is to be noted that the catching sections HG may be connected to and integrated with the inner claw sections CW2 (or the convex section 36) of the inner side wall WL2 More specifically, the inner claw sections CW2 may have the function of the catching sections HG. Further, the catching sections HG are not limited to be formed on the inner side wall WL2 but may also be formed on the outer side wall WL1. In short, insofar as a member catches on the edge of an opening HL and causes the FPC board 1 to be unmovable with respect to the front bezel BZ1 and the rear bezel BZ2, the member can be said to be the catching section HG.

Further, in the above, the claw sections CW, the convex section 36, the concave section 35, the standing sections SU, and the catching sections HG are formed at the side walls WL (outer side wall WL1 and inner side wall WL2) of the bezels BZ, while the bulging sections BG are formed on the side wall WL (thick side wall WL3) of the built-in chassis CS, but the present invention is not limited thereto.

However, if the claw sections CW, the concave section 35, the convex section 36, the standing sections SU, the catching sections HG, and the bulging sections BG are formed at the side walls WL, the thickness of the backlight unit 59, and, by extension, the thickness of the liquid crystal display device 69 do not increase due to the existence of the members (of course, the thickness of the panel unit does not increase).

Other Embodiments

It is to be noted that the present invention is not limited to the embodiments described above, and various modifications are possible which fall within the gist of the present invention.

For example, although the positions of the openings HL are not restrained on the FPC board 1, there are preferred positions. Such positions of the openings HL are described with reference to FIG. 11 and FIG. 12, together with the positions of the driver wirings 47 (47M and 47S) extending from the driver 46 and the positions of the supply wirings 11 (11M and 11S) formed on the FPC board 1.

Figure 11:
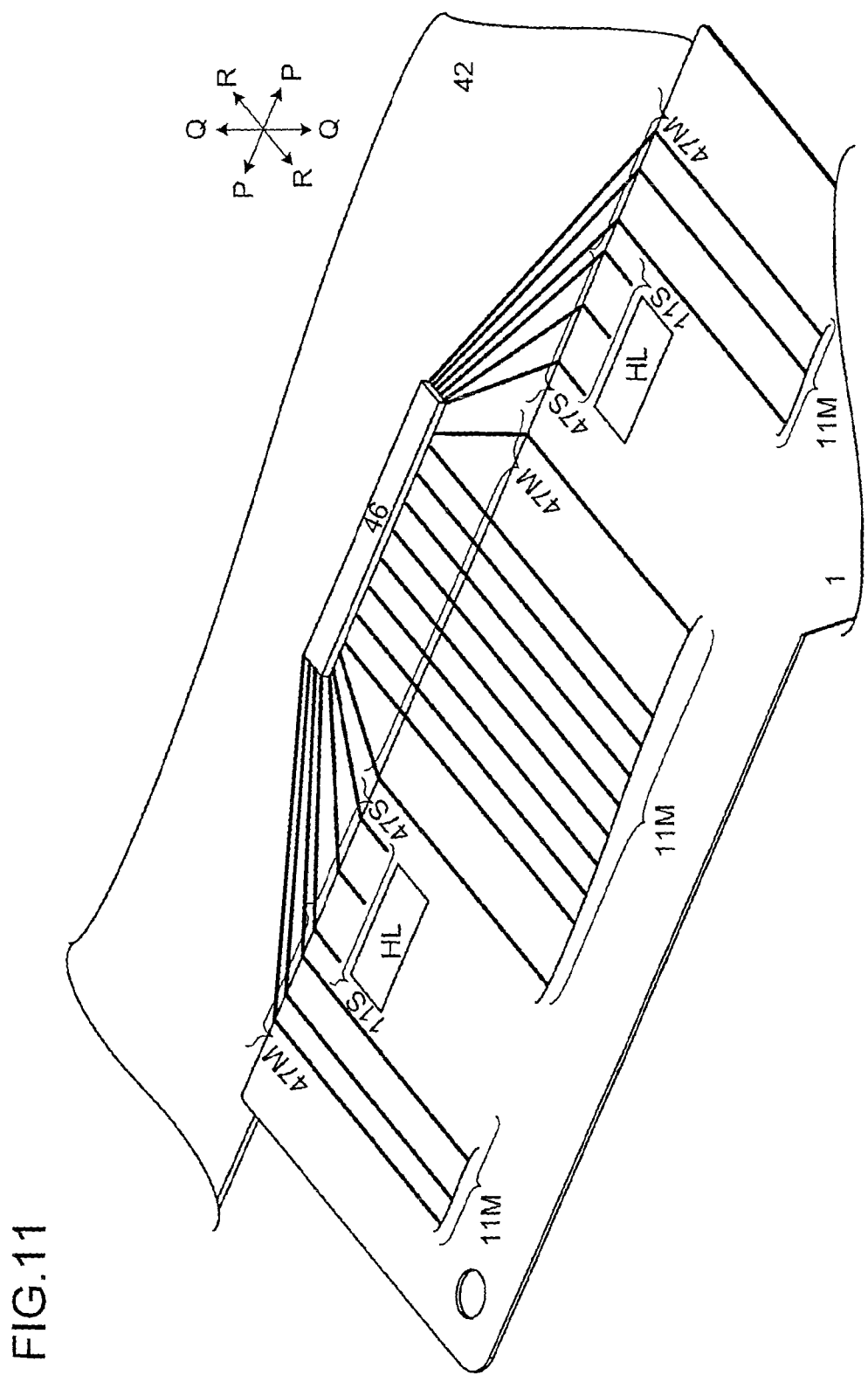
FIG. 11 is a partially enlarged perspective view of the portion around the openings in the FPC board with supply wirings and driver wirings also being illustrated therein.
Figure 12:
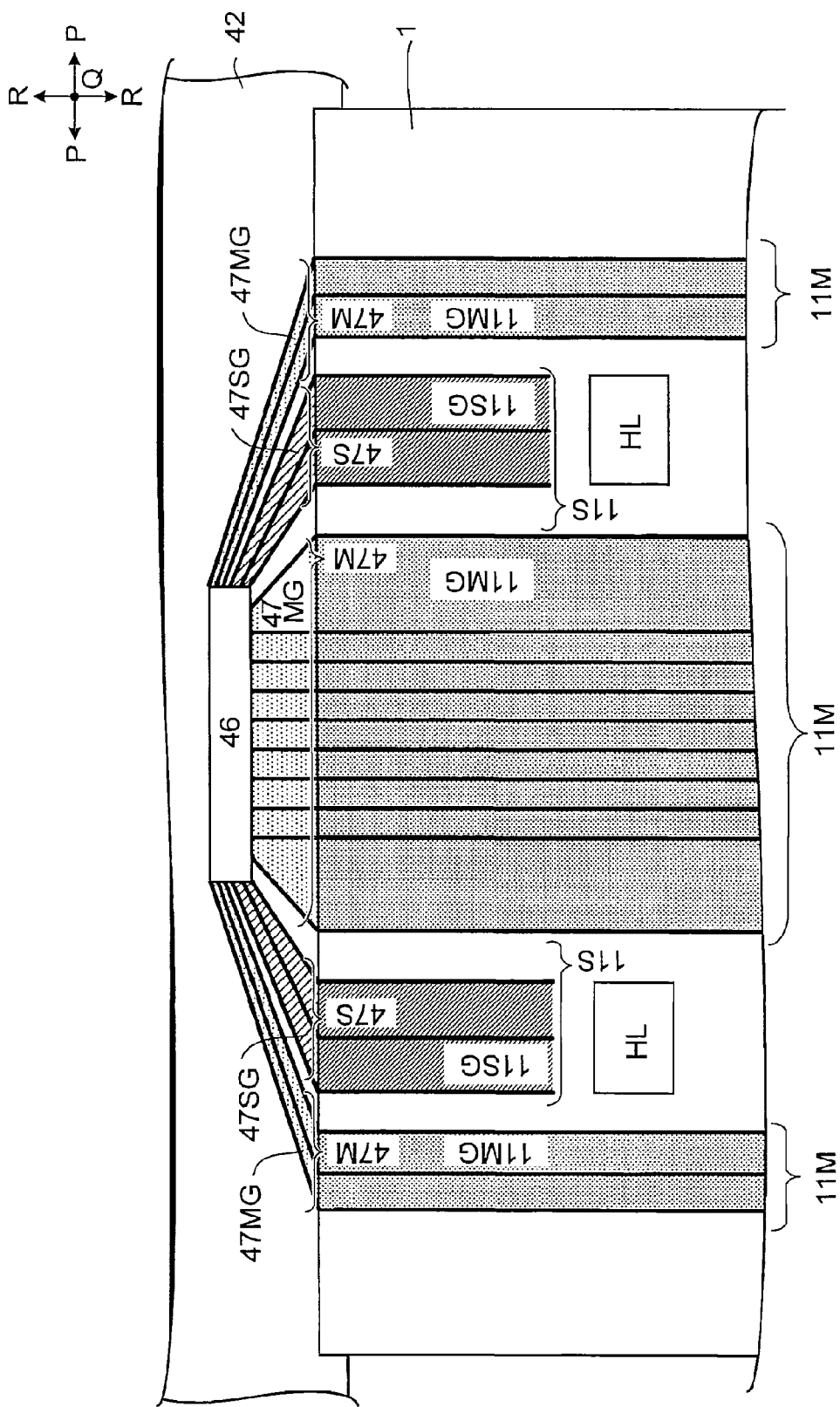
FIG. 12 is a plan view of the FPC board illustrated in FIG. 11, an active matrix board, and a driver.

FIG. 11 is a partially enlarged perspective view of the portion around the openings HL in the FPC board 1 and FIG. 12 is a plan view of the FPC board illustrated in FIG. 11. However, in the figures, only part of the driver wirings (element wirings) 47 and the supply wirings 11 are illustrated for the sake of convenience.

As illustrated in FIG. 11 and FIG. 12, the driver wirings 47 are disposed radially with the driver 46 being at the center (however, the present invention is not limited to the disposition). Two kinds of the driver wirings 47 (47M and 47S) are included in the driver wirings 47.

One kind is control driver wirings (main element wirings) 47M used for controlling the liquid crystal display panel 41, and the other kind is check driver wirings (auxiliary element wirings) 47S for checking the operation of the driver 46. Further, the control driver wirings 47M and the check driver wirings 47S are densely disposed to make groups.

Therefore, in FIG. 12, control driver wiring groups (main element wiring groups) 47MG which are groups of the control driver wirings 47M are illustrated as sparsely dotted regions while check driver wiring groups (auxiliary element wiring groups) 47SG which are groups of the check driver wirings 47S are illustrated as sparsely and diagonally shaded regions.

On the other hand, the plurality of supply wirings 11 extend along the direction R of side-by-side arrangement, and are arranged in a direction of intersecting the direction R of side-by-side arrangement (for example, in the direction P of arrangement). Those supply wirings 11 are connected to the plurality of driver wirings 47 (control driver wirings 47M and check driver wirings 47S), respectively, extending from the driver 46. Therefore, according to the control driver wirings 47M and the check driver wirings 47S, two kinds of the supply wirings 11 (11M and 11S) are included in the supply wirings 11.

More specifically, one kind is supply wirings for control (main supply wirings) 11M connected to the control driver wirings 47M, and the other kind is supply wiring for checking (auxiliary supply wiring) 11S connected to the check driver wirings 47S. Those supply wirings 11M for control and supply wirings 11S for checking are also densely disposed to make groups.

Therefore, in FIG. 12, supply wiring groups for control (main supply wiring groups) 11MG which are groups of the supply wirings 11M for control are illustrated as densely dotted regions while supply wiring groups for checking (auxiliary supply wiring groups) 11SG which are groups of the supply wirings 11S for checking are illustrated as densely and diagonally shaded regions.

It is to be noted that the supply wirings 11S for checking are, unlike the supply wirings 11M for control, not required to be connected to the power supply (not shown). Therefore, as illustrated in FIG. 11 and FIG. 12, the supply wirings 11S for checking are discontinued midway.

As described above, the two kinds of groups of the supply wirings 11, that is, 11MG and 11SG, are interspersed on the FPC board 1. The openings HL are positioned on the bending lines BR which pass through the supply wiring groups 11SG for checking, respectively (for example, positioned on a side toward which the supply wirings 11S for checking are led). More specifically, on the FPC board 1, the openings HL are positioned at isolated places which do not interfere with the supply wiring groups 11MG for control.

With the above-mentioned structure, for example, the supply wirings 11M for control are not required to have extra length so as not to interfere with the openings HL. Therefore, not only the cost of the FPC board 1 is suppressed but also mounting of the supply wirings 11M for control on the FTC board 1 becomes easier.

Further, because the supply wirings 11M for control are not restrained by the position of the openings HL, it is preferred that the supply wirings 11M for control have a shape which can conform to the shape of the FTC board 1 which bends, that is, be linear so as to conform to the bending line BR (in short, it is preferred that the direction of leading the supply wirings 11M for control be the direction R of side-by-side arrangement).

Usually, a load applied to the supply wirings 11M for control in an oblique direction is prone to break the supply wirings 11M for control. It follows that, when, because a portion of the FPC board 1 which is around a portion at which an opening HL is positioned bends, a supply wiring 11M for control which is adjacent to the opening HL curves according to the bend of the ETC board 1, it is preferred that no load in an oblique direction be applied to the curved supply wiring 11M for control. Therefore, it can be said to be preferred that the supply wirings 11M for control be linear and extend so as to conform to the bending line BR of the FPC board 1.

It is to be noted that all the supply wirings 11M for control are not necessarily required to be linear and extend so as to conform to the bending line BR of the ETC board 1. For example, in some cases, only part of the supply wirings 11M for control may be positioned at a portion of the FPC board 1 at which the FPC board 1 bends (of course, in other cases, all the supply wirings 11M for control may be positioned at a portion of the FPC board 1 at which the FPC board 1 bends).

Therefore, it is merely required that a supply wiring 11M for control which is positioned at a portion of the FPC board 1 at which the FPC board 1 bends is in a shape which conforms to the shape of the FPC board 1 that bends. The reason is that, With the above-mentioned structure, no load in an oblique direction is applied to the supply wiring 11M for control which curves according to the bend of the FPC board 1.

Figure 13:
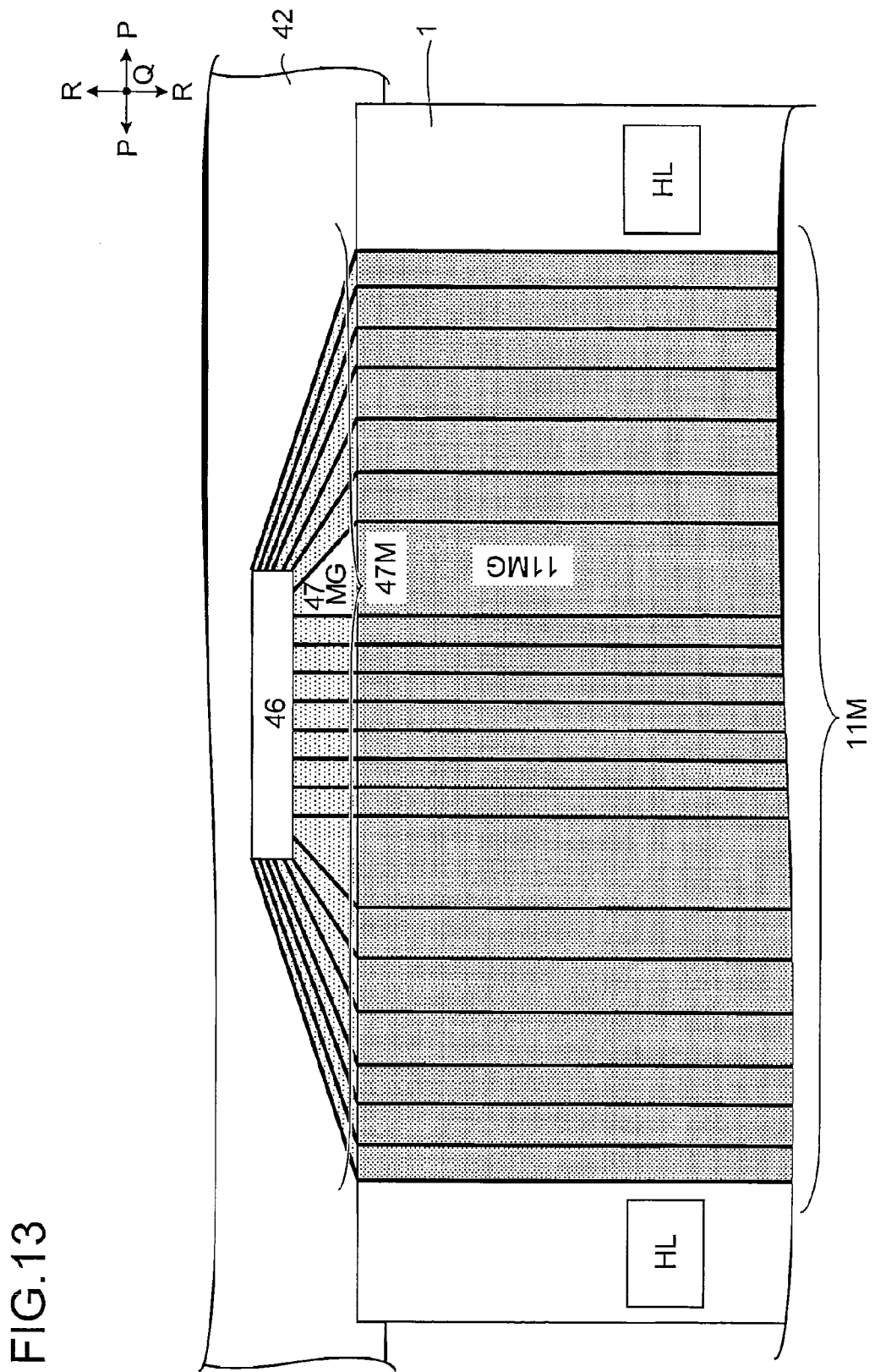
FIG. 13 is a plan view of an FPC board, an active matrix board, and a driver which are different from those illustrated in FIG. 12.

Further, the openings HL are positioned at isolated places which do not interfere with the supply wiring groups 11MG for control in the FPC board 1. However, the places are not limited to places on the bending lines BR which pass through the supply wiring groups 11SG for checking. For example, as illustrated in a plan view of FIG. 13, there may be cases in which no check driver wirings 47S exist and no supply wirings 11S for checking exist accordingly. In such a case, it is preferred that the openings HL be positioned at an outer edge in the FPC board 1, at which the supply wiring groups 11MG for control are not positioned.

Figure 14:
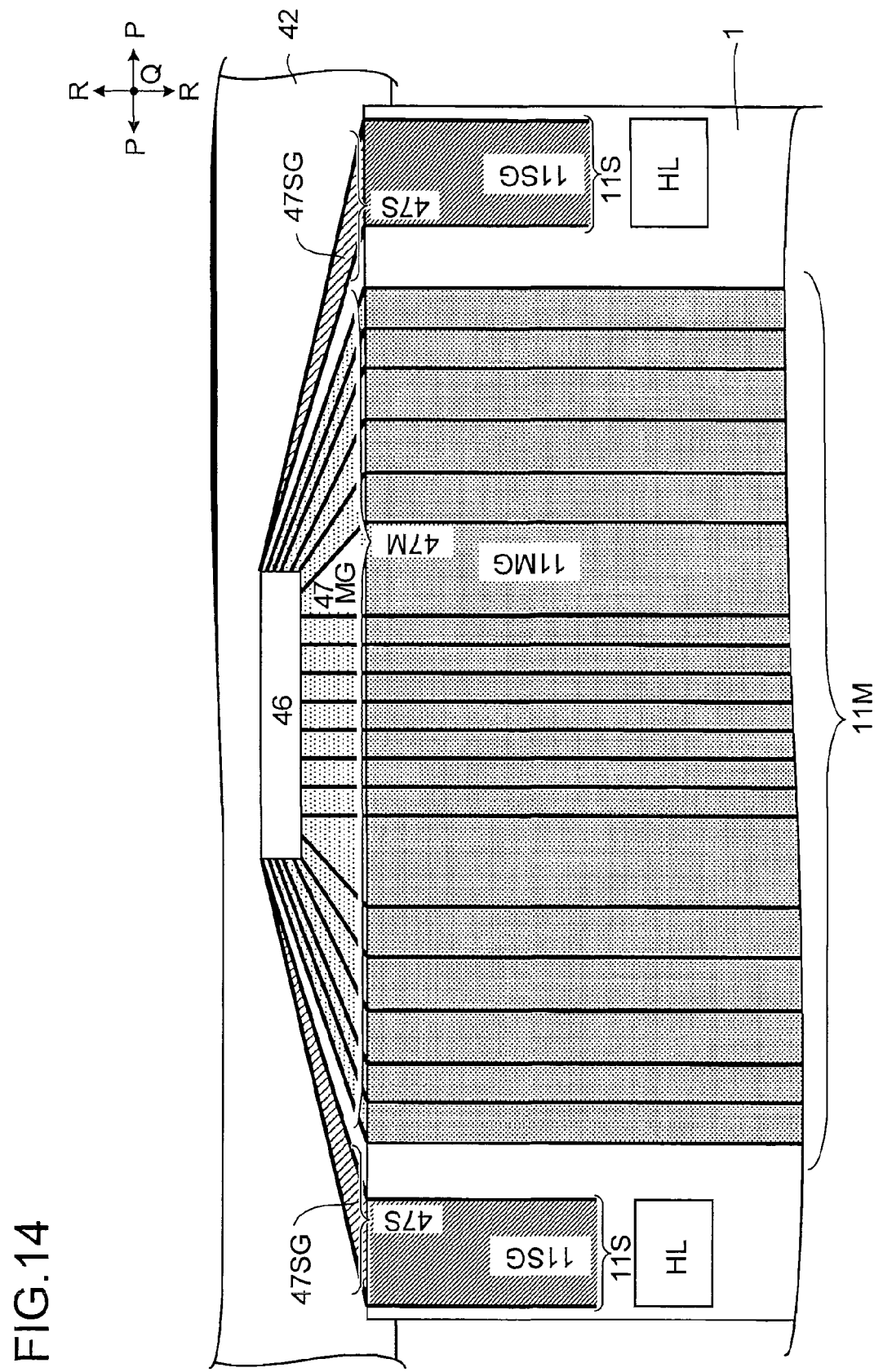
FIG. 14 is a plan view of an FPC board, an active matrix board, and a driver which are different from those illustrated in FIG. 12 and FIG. 13.
Figure 15:
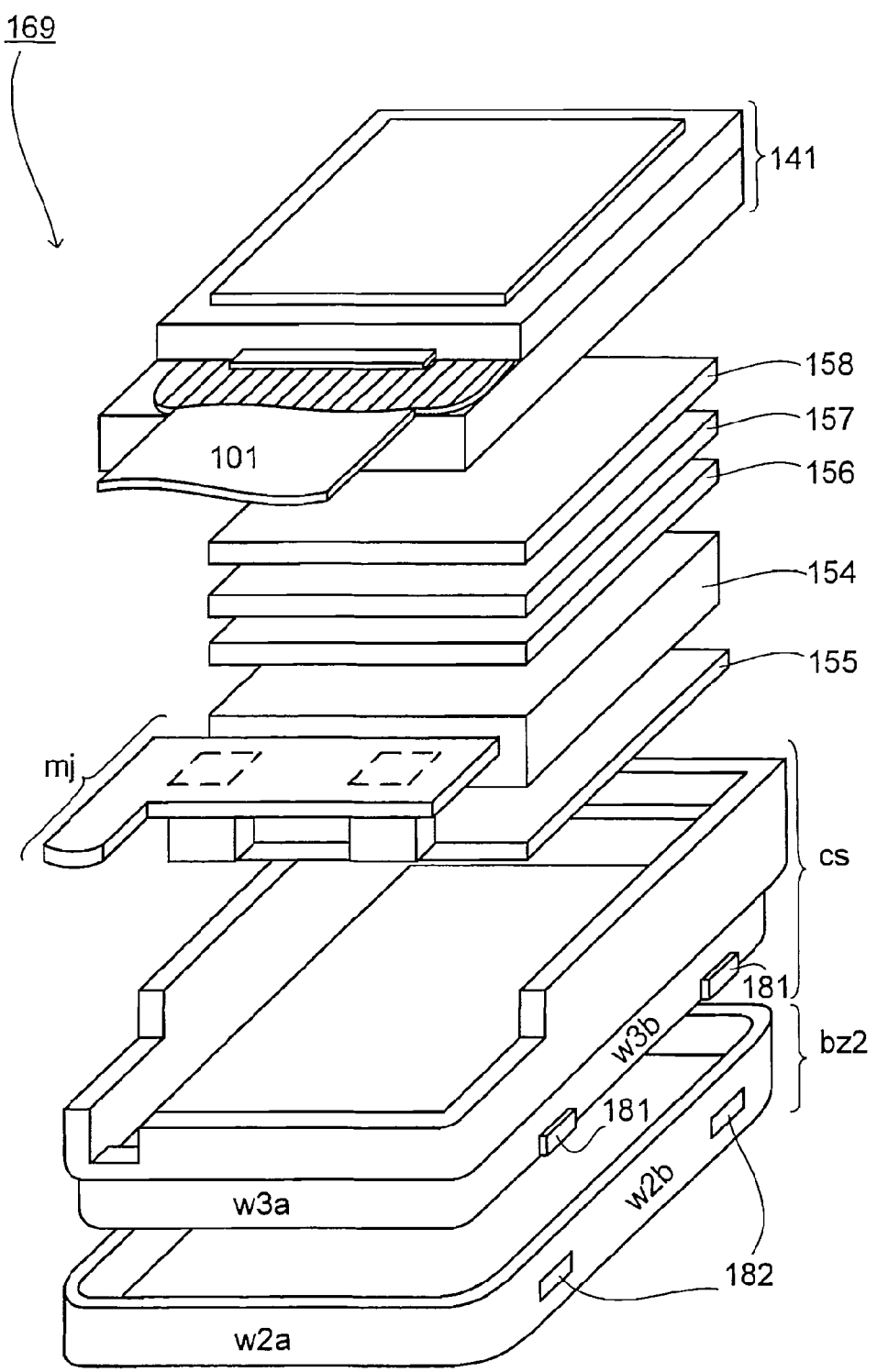
FIG. 15 is an exploded perspective view of a conventional liquid crystal display device.

In other words, the openings HL may be positioned anywhere insofar as the openings HL do not interfere with the supply wiring groups 11MG for control. Of course, as illustrated in a plan view of FIG. 14, the openings HL may be positioned at places along an outer edge of the FPC board 1 on the bending lines BR which pass through the supply wiring groups 11SG for checking.

By the way, in the above, as the engaging members (housings), the front bezel BZ1, the rear bezel BZ2, and the built-in chassis CS are described. However, the present invention is not limited thereto. Further, the number of the engaging members is two, but may be three or more. In short, it is merely required that a plurality of members include engaging sections (claw sections CW or the like), respectively, and, by the engagement between the engaging sections (at least two engaging sections), the members are engaged with each other (integrated).

Finally, electronic devices having a display device such as the liquid crystal display device 69 mounted thereon, for example, a notebook personal computer, a cellular telephone, and a PDA can also be said to be the present invention.

The invention claimed is:

1. An electronic package in which a circuit board is mounted in a housing unit, the housing unit being formed by integrating a plurality of housings, the housing unit being integrated through engagement of engaging sections included in the respective housings, wherein:
   the circuit board includes an opening; and
   at least one of the engaging sections which engage with each other passes through the opening,
   wherein the plurality of housings include a catching section for causing the circuit board to be unmovable with respect to the housing unit by catching on an edge of the opening.

2. An electronic package according to claim 1, wherein one of the engaging sections which passes through the opening enters the opening from an inside to an outside,
   provided that, in the circuit board which winds and bends, a side surrounded by the circuit board is the inside, and a side opposite to the inside is the outside.

3. An electronic package according to claim 1, wherein one of the engaging sections which passes through the opening enters the opening from an outside to an inside,
   provided that, in the circuit board which winds and bends, a side surrounded by the circuit board is the inside, and a side opposite to the inside is the outside.

4. An electronic package according to claim 1, wherein:
   the engaging sections which engage with each other are claw-like; and
   in the plurality of housings which are engaged with each other in the housing unit,
   the claw-like engaging section included in one housing extends to a side on which the one housing is separated away from another housing, and
   the claw-like engaging section included in the another housing extends to a side on which the another housing is separated away from the one housing.

5. An electronic package according to claim 1, wherein:
   among the engaging sections which engage with each other, one engaging section is convex and another engaging section is concave; and
   the convex engaging section enters the opening from one board surface of the circuit board.

6. An electronic package according to claim 1, wherein the engaging sections are positioned at side walls of the housing unit.

7. An electronic package according to claim 1, wherein:
   the circuit board is divided into two according to a dividing line which passes through the opening, to thereby provide one region having a smaller area, which is a small area region, and another region having a larger area, which is a large area region; and
   the catching section pulls a portion of the circuit board which is the small area region toward a portion of the circuit board which is the large area region,
   provided that a line along a shape of the circuit board which bends is a bending line, a virtual plane which includes the bending line and intersects a board surface of the circuit board is a first virtual plane, and a line which intersects the first virtual plane is the dividing line.

8. An electronic package according to claim 7, wherein one of the engaging sections also serves as the catching section.

9. A display device comprising the electronic package according to claim 1 mounted thereon.

10. A display device according to claim 9, wherein:
    the circuit board is connected to a display panel for displaying a display image, the display panel including a control element mounted thereon so as to be along the circuit board;

the control element including a plurality of element wirings, the plurality of element wirings including a main element wiring group which is a group of main element wirings; and the opening is positioned at an isolated place which does not interfere with the main supply wiring group, provided that supply wirings of the circuit board which are connected to the main element wirings are main supply wirings and a group of the main supply wirings is the main supply wiring group.

11. A display device according to claim 10, wherein the isolated place comprises a place along an outer edge in the circuit board.

12. A display device according to claim 10, wherein:

the plurality of element wirings include an auxiliary element wiring group which is a group of auxiliary element wirings; and the isolated place is positioned on a bending line which passes through an auxiliary supply wiring group, provided that supply wirings of the circuit board which are connected to the auxiliary element wirings are auxiliary supply wirings and a group of the auxiliary supply wirings is the auxiliary supply wiring group, and provided that a line along a shape of the circuit board which bends is the bending line.

13. A display device according to claim 10, wherein:

at least part of the main supply wirings are positioned at a portion of the circuit board at which the circuit board bends; and the main supply wiring positioned at the portion of the circuit board at which the circuit board bends is in a shape which conforms to the shape of the circuit board which bends.

14. An electronic device comprising the display device according to claim 9 mounted thereon.

* * * * *